United States Patent
Ikeda

(10) Patent No.: US 10,043,810 B1
(45) Date of Patent: Aug. 7, 2018

(54) DYNAMIC RANDOM ACCESS MEMORY AND METHOD OF FABRICATING THE SAME

(71) Applicant: Winbond Electronics Corp., Taichung (TW)

(72) Inventor: Noriaki Ikeda, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/680,217

(22) Filed: Aug. 18, 2017

(51) Int. Cl.
*H01L 29/49* (2006.01)
*H01L 27/108* (2006.01)

(52) U.S. Cl.
CPC .... *H01L 27/10888* (2013.01); *H01L 27/1087* (2013.01); *H01L 27/10885* (2013.01); *H01L 27/10891* (2013.01)

(58) Field of Classification Search
CPC ........... H01L 23/5386; H01L 23/49811; H01L 23/544; H01L 27/10888; H01L 27/10823
See application file for complete search history.

(56) References Cited

U.S. PATENT DOCUMENTS

| | | | |
|---|---|---|---|
| 6,573,137 B1 | 6/2003 | Divakaruni et al. | |
| 6,576,945 B2 | 6/2003 | Mandelman et al. | |
| 7,355,230 B2 | 4/2008 | Thies et al. | |
| 8,390,062 B2 | 3/2013 | Kobayashi et al. | |
| 2011/0143508 A1 | 6/2011 | Kim et al. | |
| 2014/0256104 A1 | 9/2014 | Nagai | |
| 2015/0214231 A1* | 7/2015 | Lee | H01L 27/10823 |
| 2016/0163712 A1* | 9/2016 | Anderson et al. | H01L 27/10829 |

* cited by examiner

*Primary Examiner* — Michael Shingleton
(74) *Attorney, Agent, or Firm* — JCIPRNET

(57) ABSTRACT

A dynamic random access memory (DRAM) is provided. The DRAM comprises a substrate, a plurality of isolation structures, a plurality of word lines, a plurality of bit line contacts and a plurality of buried bit lines. The isolation structures are located in the substrate and defines a plurality of active regions extending along a first direction. The word lines are located in the substrate and are extending along a second direction, the second direction intersects with the first direction. The bit line contacts are located above the isolation structures, wherein each of the bit line contacts have a diffusion region that defines a bit line side contact. The buried bit lines are located above the bit line contacts and are connected to the active region via the bit line side contact, the buried bit lines are extending along the first direction and is parallel with the plurality of active regions.

16 Claims, 37 Drawing Sheets

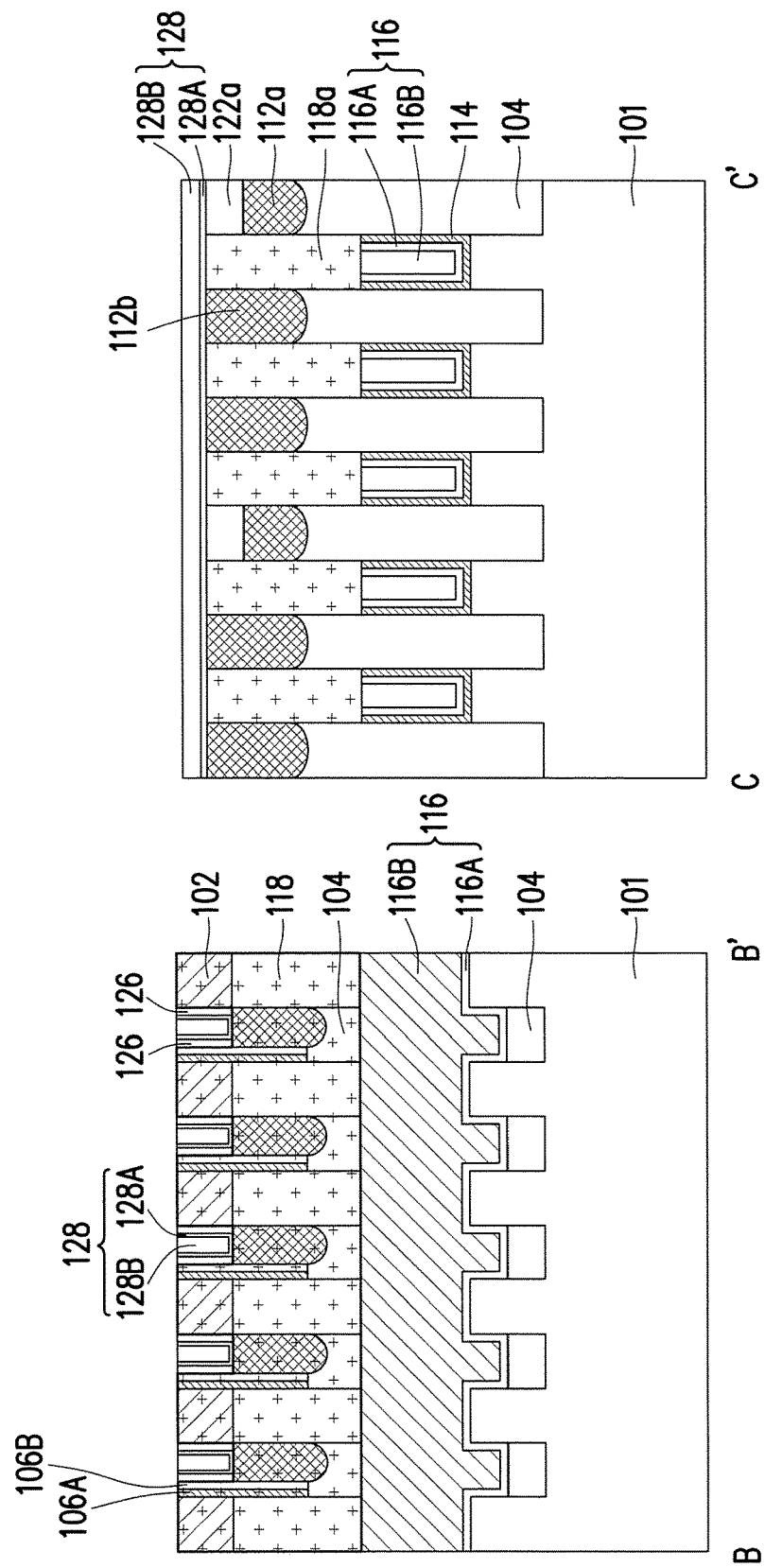

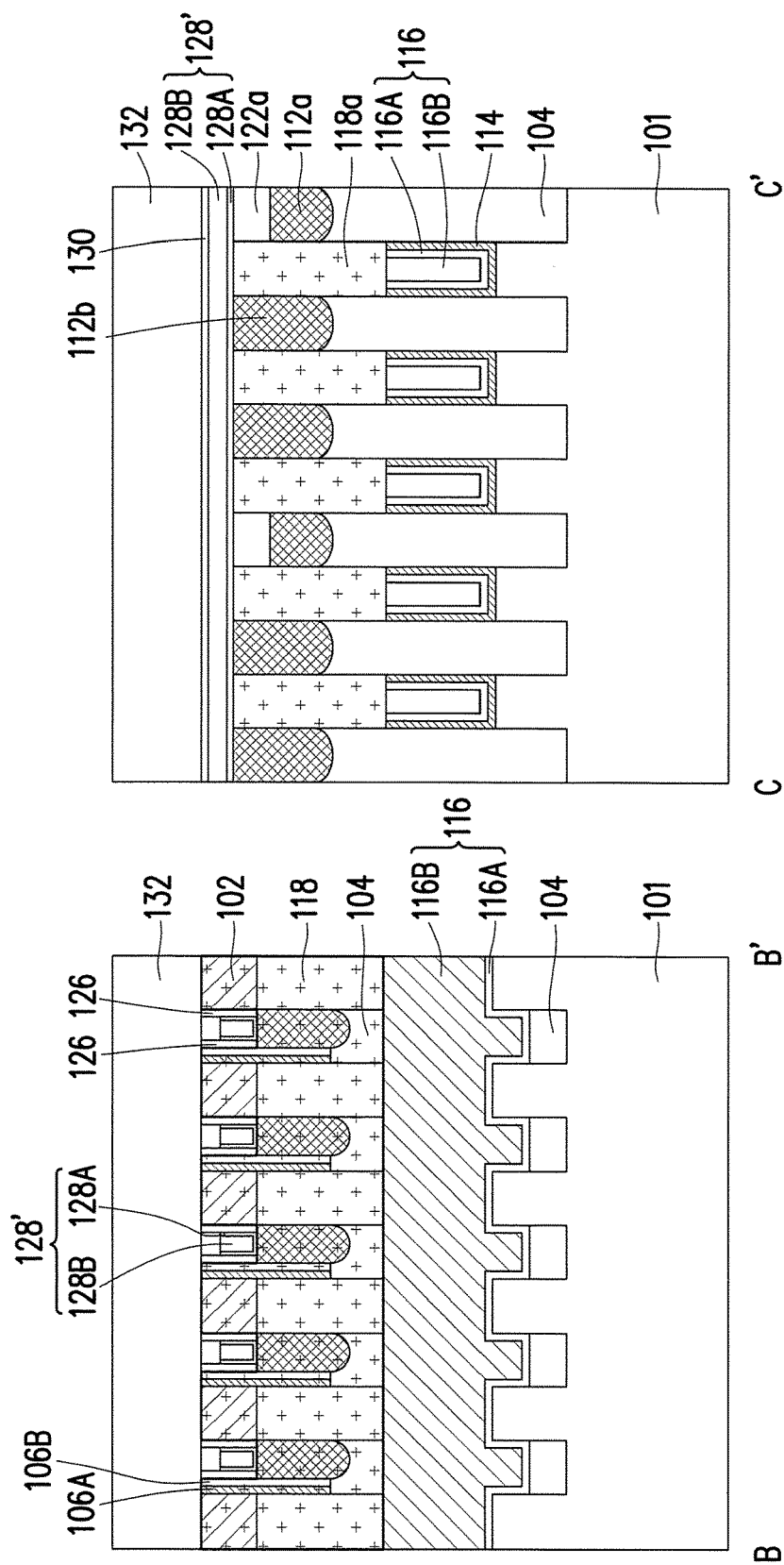

DYNAMIC RANDOM ACCESS MEMORY AND METHOD OF FABRICATING THE SAME

BACKGROUND OF THE INVENTION

1. Field of the Invention

The invention relates to a dynamic random access memory and a method of fabricating the same.

2. Description of Related Art

As the design size of the dynamic random access memory (DRAM) becomes smaller, the semiconductor apparatus is constantly developed to have higher density. In general, conventional DRAM memory cell needs an angled active area layout, this is because the capacitor must be connected to an active area without short circuit to bit lines. Due to the angled active area layout, a pitch between the active area is tightened, which in turn induce problems such as lithography difficulty, high bit line parasitic capacitance, poor bit line sensing margin etc. Therefore, how to improve the performance and design of dynamic random access memory is an important issue in the related art.

SUMMARY OF THE INVENTION

Accordingly, the present invention provides a dynamic random access memory and a method of fabricating the same that can resolve the problems of lithography difficulty, small active contact area to storage node contact, poor write recovery time characteristic, high bit line parasitic capacitance and poor bit line sensing margin.

An embodiment of the invention provides a dynamic random access memory including a substrate, a plurality of isolation structures, a plurality of word lines, a plurality of bit line contacts and a plurality of buried bit lines. The plurality of isolation structures is located in the substrate, wherein the plurality of isolation structure defines a plurality of active regions extending along a first direction. The plurality of bit line contacts is located above the plurality of isolation structures, wherein each of the bit line contacts have a diffusion region that defines a bit line side contact. The plurality of buried bit lines is located above the plurality of bit line contacts, wherein each of the buried bit lines is connected to the active region via the bit line side contact, the buried bit lines is extending along the first direction and is parallel with the plurality of active regions.

An embodiment of the invention further provides a method of fabricating a dynamic random access memory including the following steps. A substrate is provided and trenches are defined in the substrate. A plurality of isolation structures is formed in the trenches of the substrate, and the plurality of isolation structures defines a plurality of active regions extending along a first direction. Liners and spacers are formed above the isolation structures and on one sidewall of the trenches through an angled ion implantation process. A plurality of word lines is formed in the substrate, wherein the plurality of word lines is extending along a second direction, the second direction intersects with the first direction. A plurality of bit line contacts is formed above the plurality of isolation structures, wherein each of the bit line contacts have a diffusion region that defines a bit line side contact, the liners and the spacers are covering one side of each of the bit line contacts. A plurality of buried bit lines is formed to be located above the plurality of bit line contacts, wherein each of the buried bit lines is connected to the active region via the bit line side contact, the buried bit lines is extending along the first direction and is parallel with the plurality of active regions.

In an embodiment of the invention, the formation of the liners and the spacers above the isolation structures and on the one sidewall of the trenches through the angled ion implantation process includes the following steps. The liners and the spacers are formed on a first sidewall and a second sidewall of the trenches above the isolation structure. First oxide layers are formed in the trenches in between the liners and the spacers that are located on the first sidewall and the second sidewall. A mask is formed to fill into the trenches to cover the first oxide layers, the liners and the spacers. Angled ion implantation is performed on the mask so that there are portions of the mask with and without ion implantation. Portions of the mask without the ion implantation are selectively removed so that the liners and the spacers formed on the second sidewall of the trenches are exposed. The liners and the spacers on the second sidewall that are exposed are removed, and the first oxide layers are removed from the trenches. The mask is removed. Second oxide layers are formed in the trenches so that one side of the second oxide layers is covered by the liners and the spacers formed on the first sidewall.

Based on the above, the dynamic random access memory of the invention is formed with buried bit lines being parallel with the active regions, and a bit line side contact is used to connect the buried bit lines to the active region. As such, a pitch between the active area is relaxed, and a larger active area can be used to achieve a more photo (lithography) friendly process. In addition, by having bit line side contacts and buried bit lines in the DRAM structure, a bit line parasitic capacitance is reduced and the bit line sensing margin may be improved. Overall, a dynamic random access memory having better design and performance is achieved.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
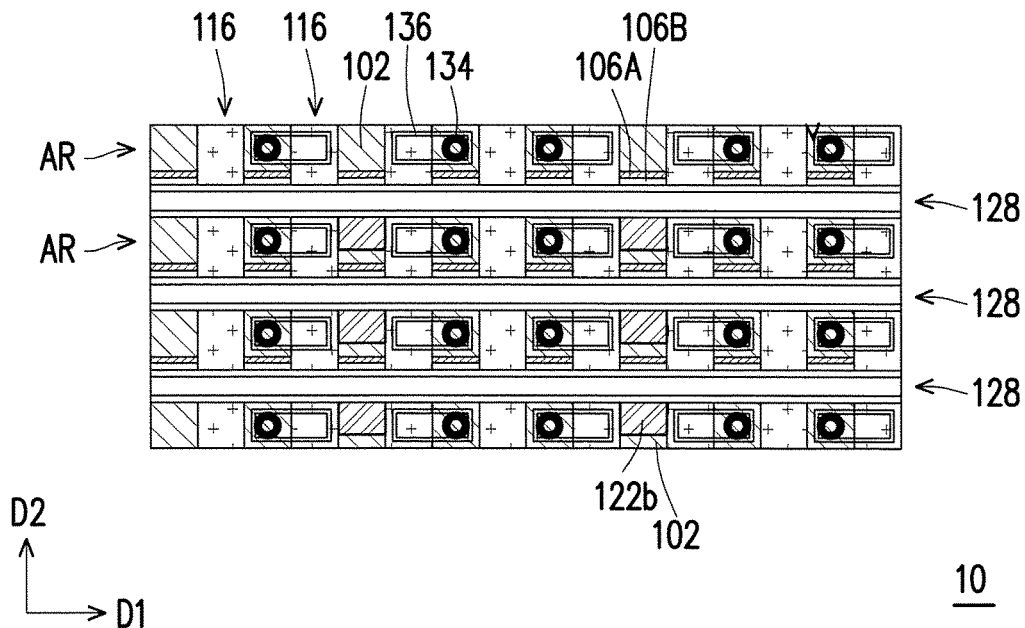
FIG. 1 is a schematic top view of a dynamic random access memory (DRAM) in accordance with an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

As shown in FIG. 1, a dynamic random access memory 10 of the embodiment includes a plurality of active regions AR, a plurality of word lines 116, a plurality of buried bit lines 128, a plurality of bit line contacts (having side contacts 122b), a plurality of capacitor contacts 134 and a plurality of capacitors 136. In the present embodiment, the plurality of active regions AR is defined by isolation structures (not shown) so that the active regions AR extends along a first direction D1. The plurality of word lines 116 is extending along a second direction D2, wherein the second direction D2 intersects with the first direction D1. In particular, the first direction D1 is perpendicular to the second direction D2. The plurality of bit line contacts is located above the isolation structures (not shown), and each of the bit line contacts have a diffusion region that defines a bit line side contact 122b. The plurality of buried bit lines 128 is located above the plurality of bit line contacts, and each of the buried bit lines 128 is connected to the active region AR via the bit line side contact 122b.

In the present embodiment, the plurality of active regions AR and the plurality of buried bit lines 128 respectively forms a straight line extending along the first direction D1. By having such a straight active area layout, the interface resistance between the capacitor 136 to the active area AR is reduced. As such, a pitch between the active areas AR is relaxed, and a larger active area AR can be used to achieve a more photo (lithography) friendly process. In addition, the buried bit lines 128 is connected to the active region AR via the bit line side contact 122b. With such configuration, a distance between the bit lines 128 to the capacitor contacts 134 is increased as compared to conventional structures. Therefore, a bit line parasitic capacitance is reduced and the bit line sensing margin may be improved. The method for fabricating the dynamic random access memory 10 of the embodiment by having a straight active area layout, with buried bit lines 128 and a bit line side contact 122b will be described with reference to FIG. 2A to FIG. 2O.

Figure 2A:
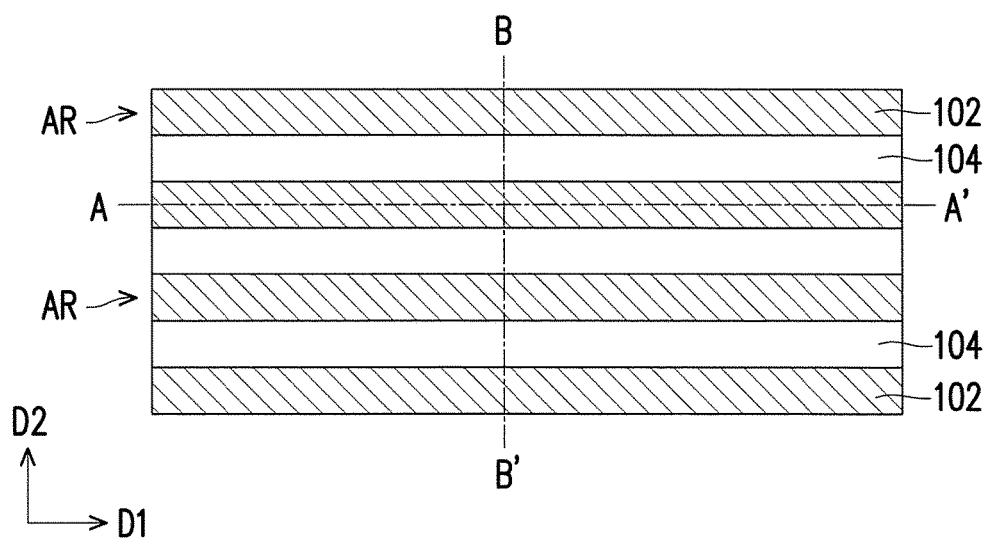
FIG. 2A to FIG. 2O illustrate a process flow for manufacturing a dynamic random access memory (DRAM) in accordance with an embodiment of the invention.
Figure 2B:
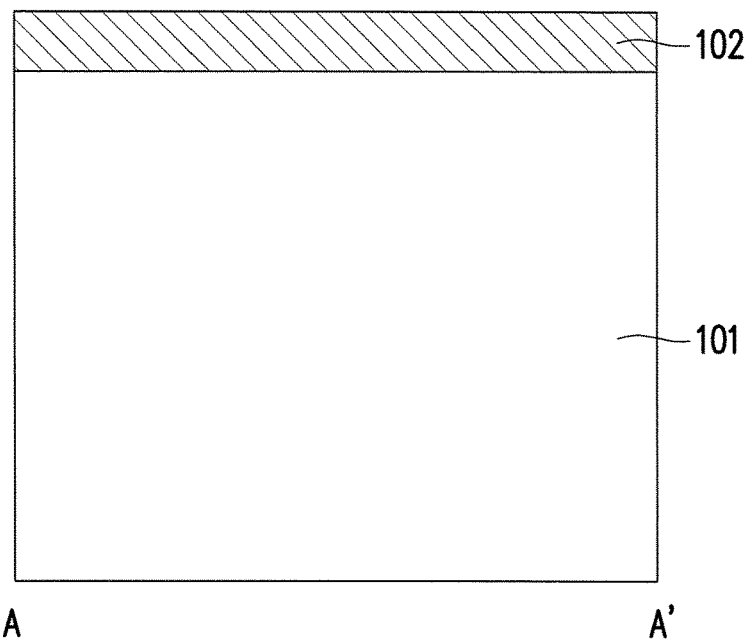
Figure 2C:
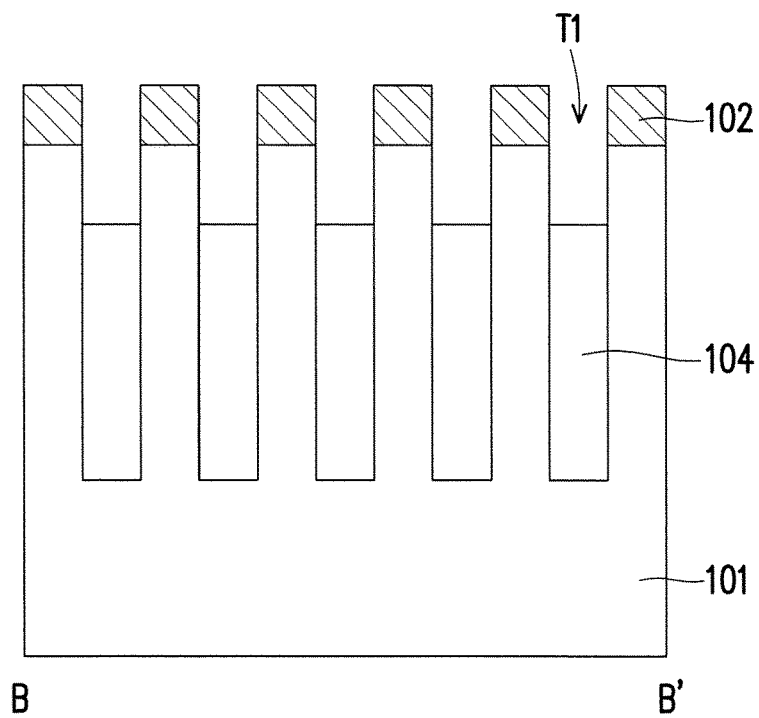

FIG. 2A to FIG. 2O respectively show a schematic top view and sectional views of different stage of manufacturing a dynamic random access memory 10 shown in FIG. 1. In these figures, a top view will be shown, and section views taken along line A-A', taken along line B-B', taken along line C-C', or taken along line D-D' of the top view figure will be presented thereafter. For example, FIG. 2A is a schematic top view of a stage of manufacturing a dynamic random access memory 10 shown in FIG. 1. FIG. 2B is a sectional view taken along line A-A' in FIG. 2A. FIG. 2C is a sectional view taken along line B-B' in FIG. 2A. The same concept of top views and sectional views may be applied to the figures shown in FIG. 3A-3C to FIG. 19A-19E.

Please first refer to FIG. 2A to FIG. 2C, a substrate 101 is provided, and a mask layer 102 is formed on the substrate 101. After forming the mask layer 102, trenches T1 are defined in the substrate 101 and the mask layer 102 through etching so that active regions AR maybe defined thereafter. Subsequently, a plurality of isolation structures 104 are formed in the trenches T1 of the substrate 101. In particular, the isolation structures 104 are formed to define the active region AR, wherein the active region AR forms a straight line that extends along the first direction D1.

Figure 3A:
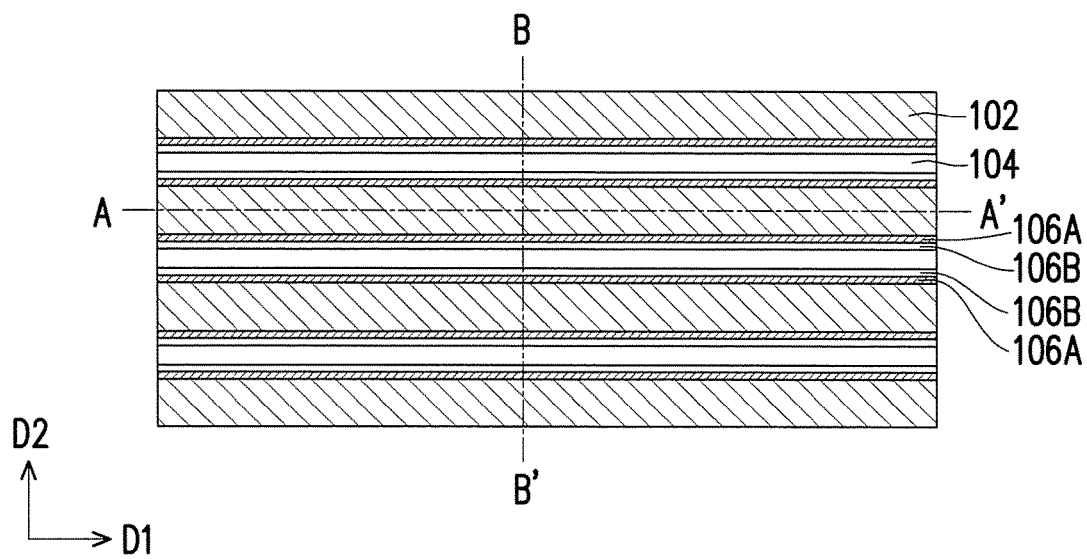
Figure 3B:
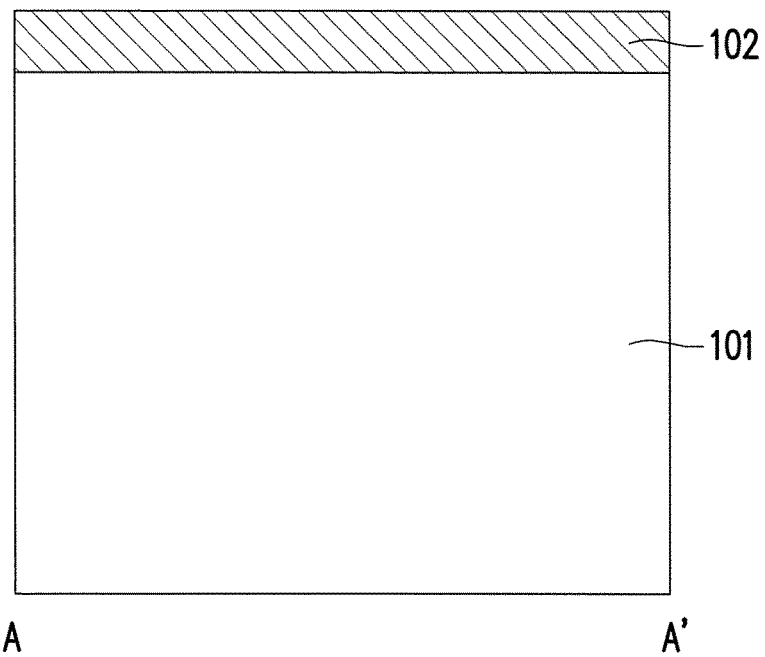
Figure 3C:
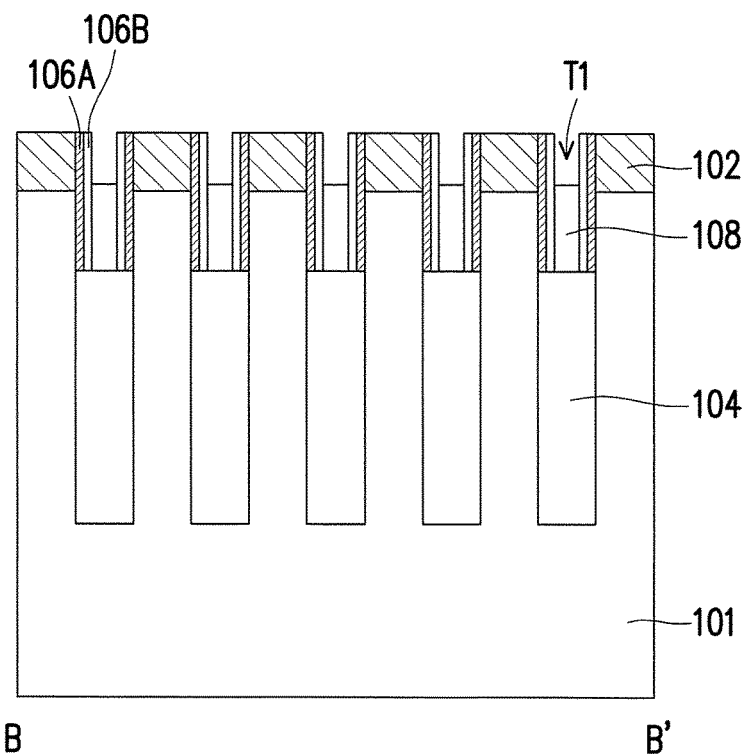

Next, please refer to FIG. 3A to FIG. 3C, after forming the isolation structures 104, liners 106A and spacers 106B are formed above the isolation structures 104 and on sidewalls of the trenches T1. In the embodiment, the liners 106A are first formed to fill into the trenches T1 and to cover two opposing sidewalls of the trenches T1. The liners 106A are for example, formed on top of the mask layer 102 to cover the mask layer 102, and are etched back to be coplanar with the mask layer 102 in a subsequent process. Liners 106A are for example, formed by an in-situ steam generation (ISSG) oxidation process. After forming the liners 106A, the spacers 106B are then formed in the trenches T1 to cover the liners 106A, wherein the spacers 106B are also located on two opposing sidewalls of the trenches T1. In some embodiments, a material of the spacers 106B is for example, silicon nitride, but not limited thereto.

After forming the liners 106A and spacers 106B, a first oxide layer 108 is formed to fill into the trenches T1. The first oxide layer 108 is, for example, a silicon oxide ($SiO_2$) layer with high wet rate. More specifically, the first oxide layer 108 is formed in the trenches T1 and is located in between the liners 106A and spacers 106B on two opposing sidewalls (first and second sidewalls) of the trenches T1. The process of forming the first oxide layer 108 is for example, by first forming an oxide layer (not shown) that completely covers the liners 106A, the spacers 106B and the trenches T1. An etch-back process is then performed on the oxide layer so as to form the first oxide layer 108, which is located within the trenches T1. In addition, a planarization process may be performed so that top surfaces of the mask layer 102, the liners 106A and the spacers 106B are coplanar with each other. The planarization process may, for example, be a chemical mechanical polishing (CMP) process.

Figure 4A:
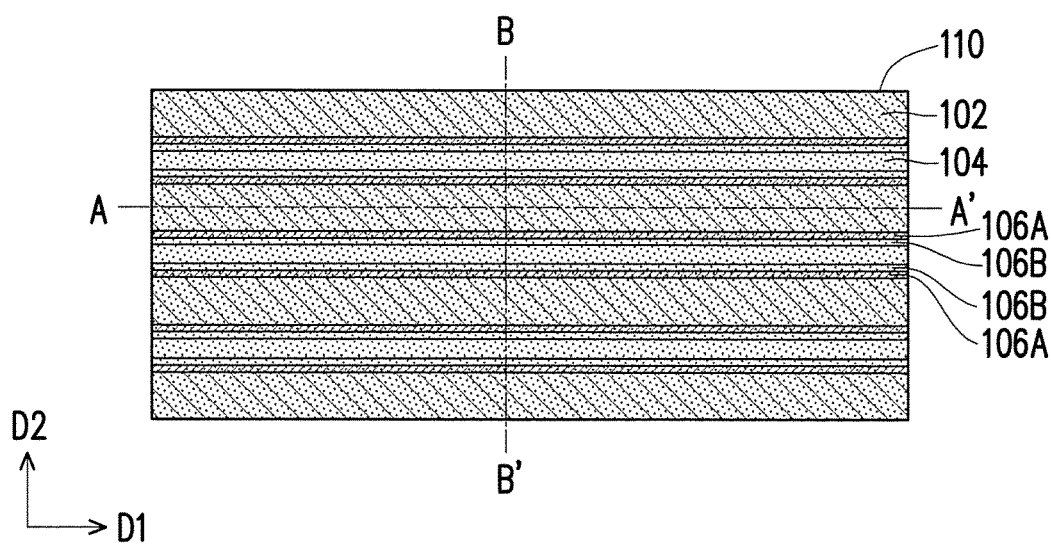
Figure 4B:
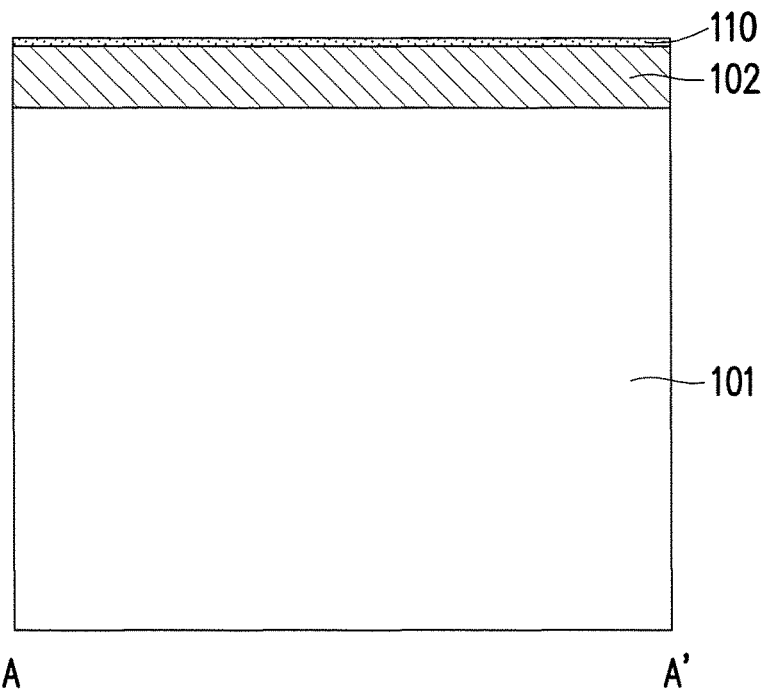
Figure 4C:
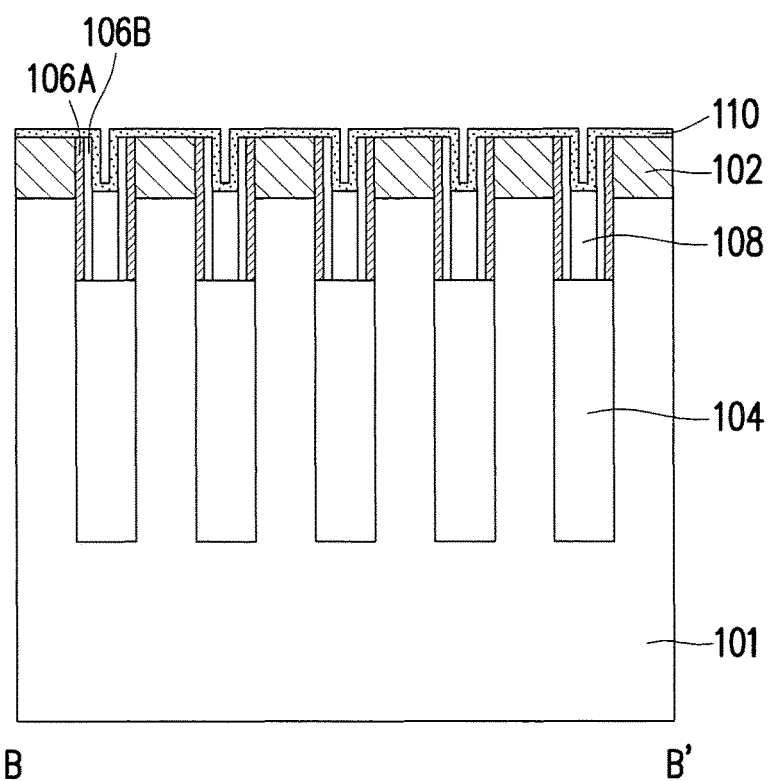

Next, please refer to FIG. 4A to FIG. 4C, after forming the first oxide layers 108, a mask 110 that fills into the trenches T1 and covers the first oxide layers 108, the liners 106A and the spacers 106B is formed. In particular, the mask 110 conformally covers the mask layer 102, the liners 106A, the spacers 106B and the first oxide layers 108. In the present embodiment, a material of the mask 110 is, for example, undoped amorphous silicon (a-Si).

Figure 5A:
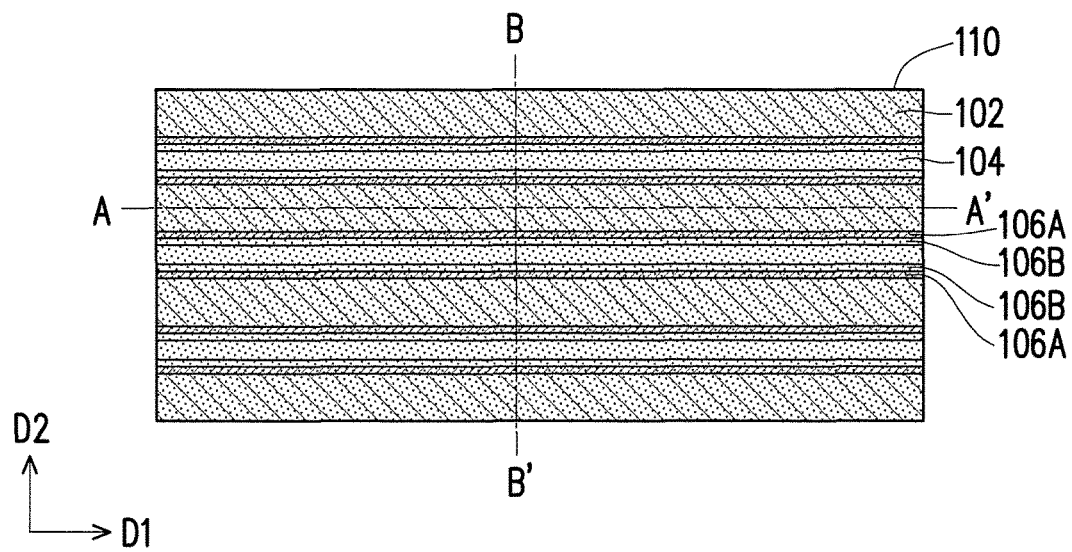
Figure 5B:
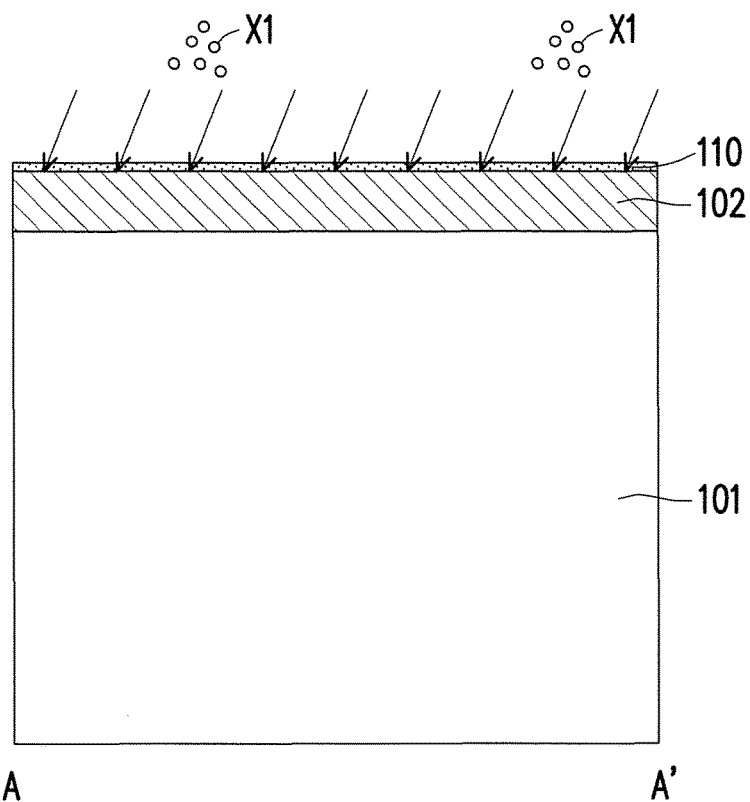
Figure 5C:
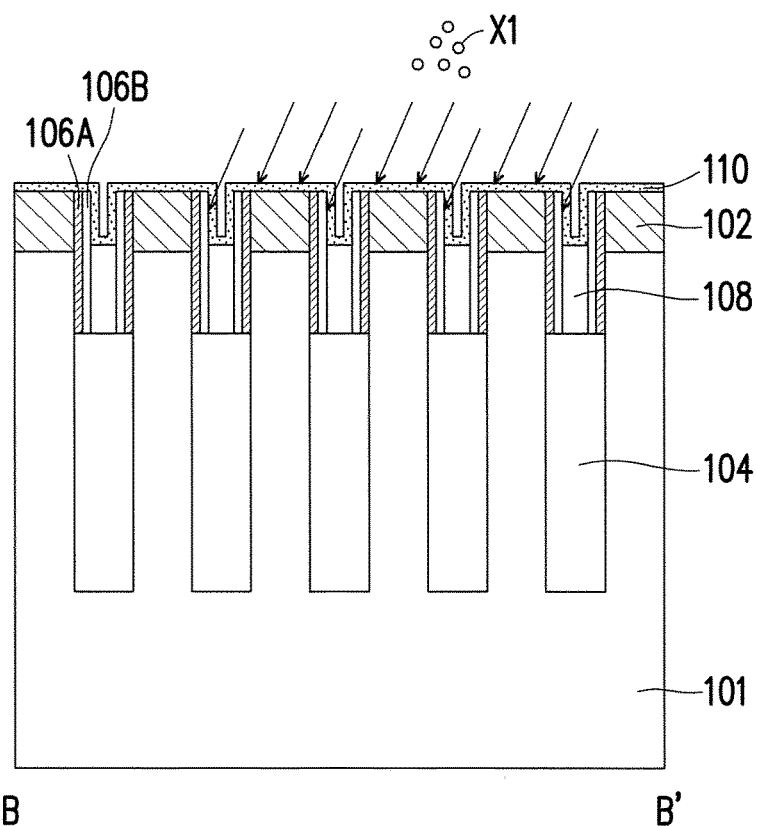

Next, please refer to FIG. 5A to FIG. 5C, after forming the mask 110, an angled ion implantation process (indicated by arrows) is performed on the mask 110, so that there are portions of the mask 110 with and without ion implantation. In an embodiment of the invention, the angled ion implantation process is performed by using angled phosphorous ion implantation. For example, as shown in FIG. 7B and FIG. 7C, phosphorous ions X1 are implanted to the mask 110 at an angle, so that there will be portions of the mask 110 with phosphorous ion implantation and portions of the mask 110 without phosphorous ion implantation. Although phosphorous ions are used in the present embodiment for the angled ion implantation process, however, the invention is not particularly limited thereto. For example, in alternative embodiments, other type of ions may be used for the angled ion implantation process as long as portions of the mask 110 are selectively removed in a subsequent step.

Figure 6A:
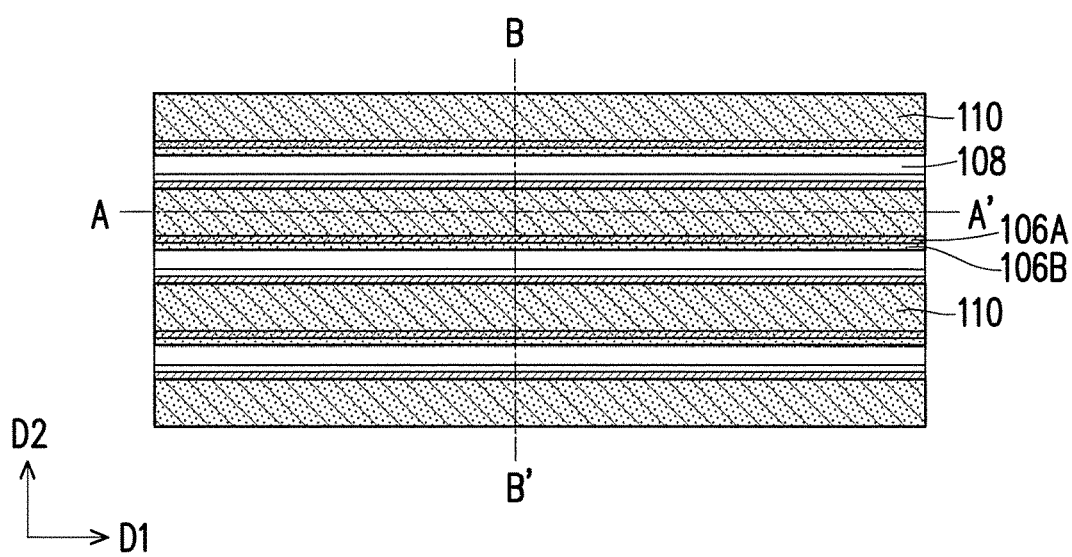
Figure 6B:
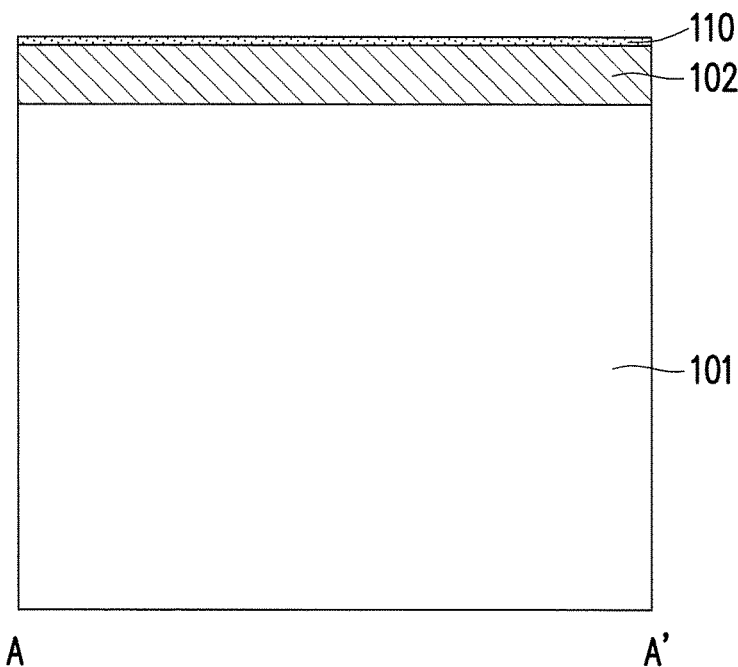
Figure 6C:
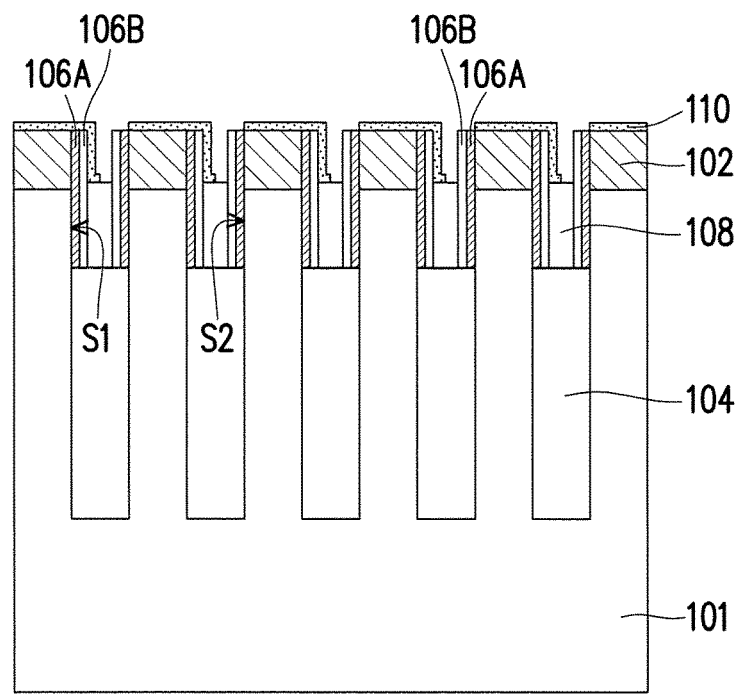

Next, please refer to FIG. 6A to FIG. 6C, after the angled ion implantation process, portions of the mask 110 without the phosphorous implantation is selectively removed. The area on the mask 110 without phosphorous implantation is, for example, removed by ammonia wet etch with high selectivity. After removing portions of the mask 110, the first oxide layers 108, and the liners 106A and the spacers 106B formed on one of the sidewalls (second sidewall S2) of the trenches T1 are exposed. In addition, the liners 106A and the spacers 106B formed on another opposing sidewall (first sidewall S1) of the trenches T1 are still covered by the mask 110.

Figure 7A:
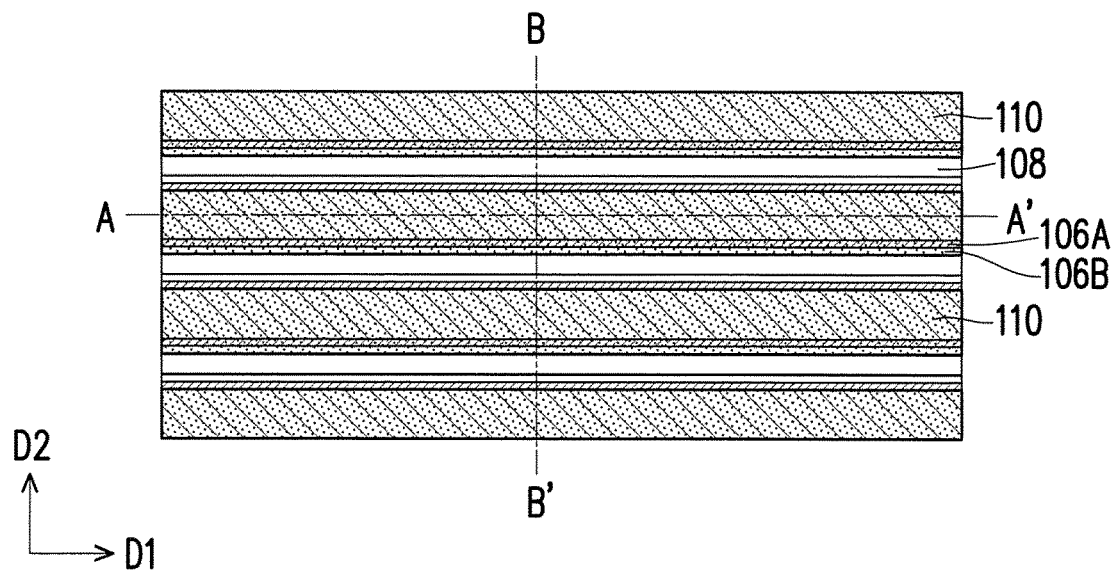
Figure 7B:
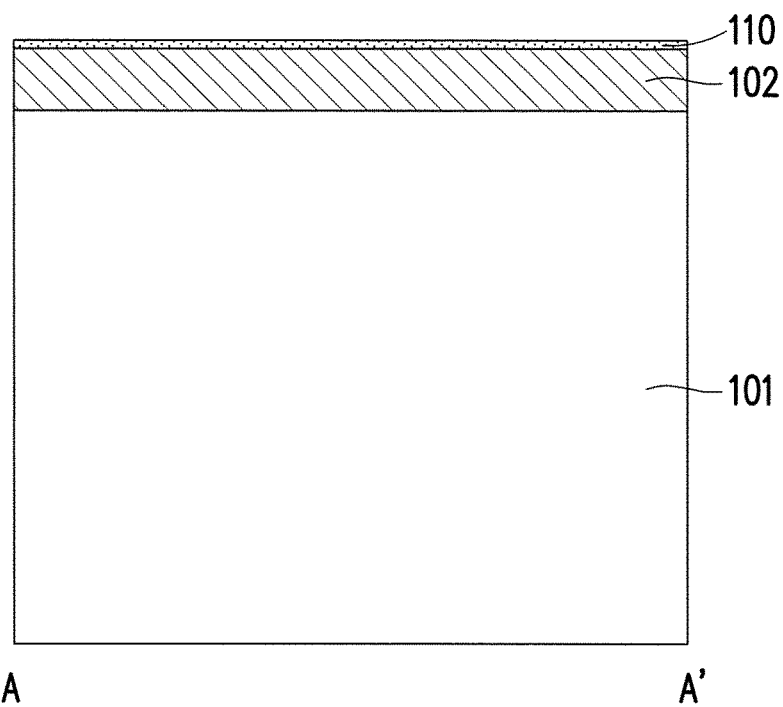
Figure 7C:
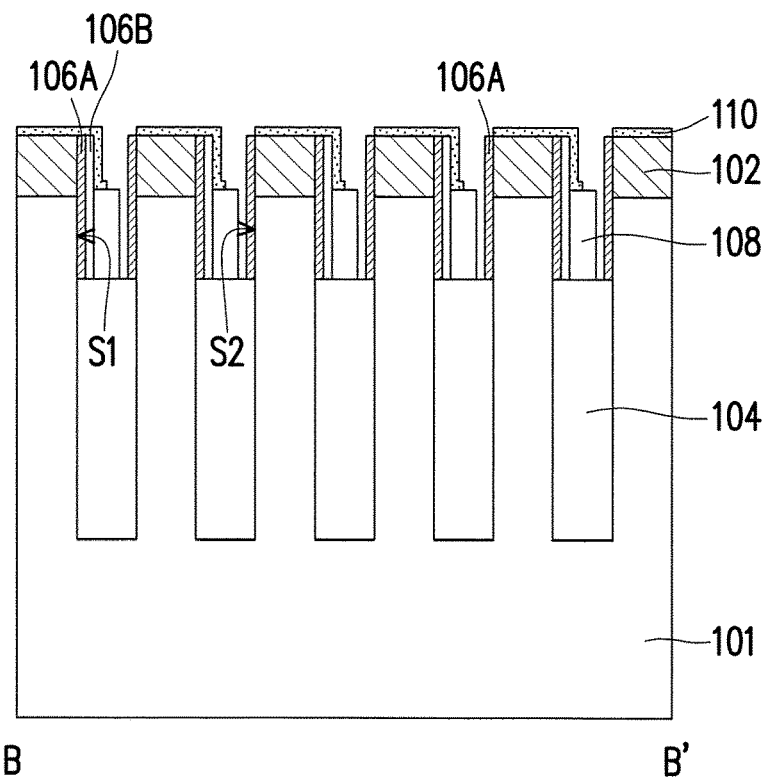
Figure 8A:
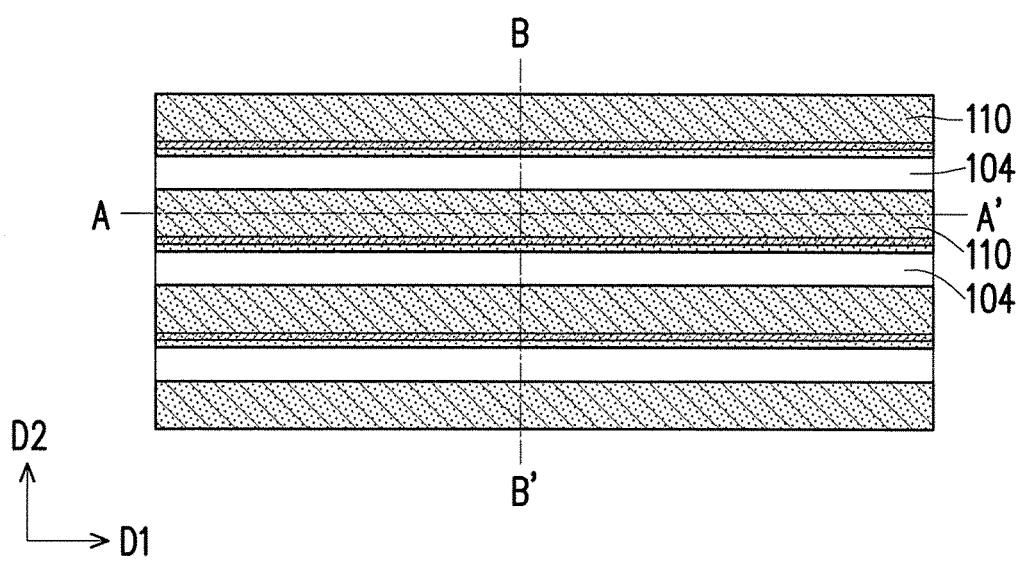
Figure 8B:
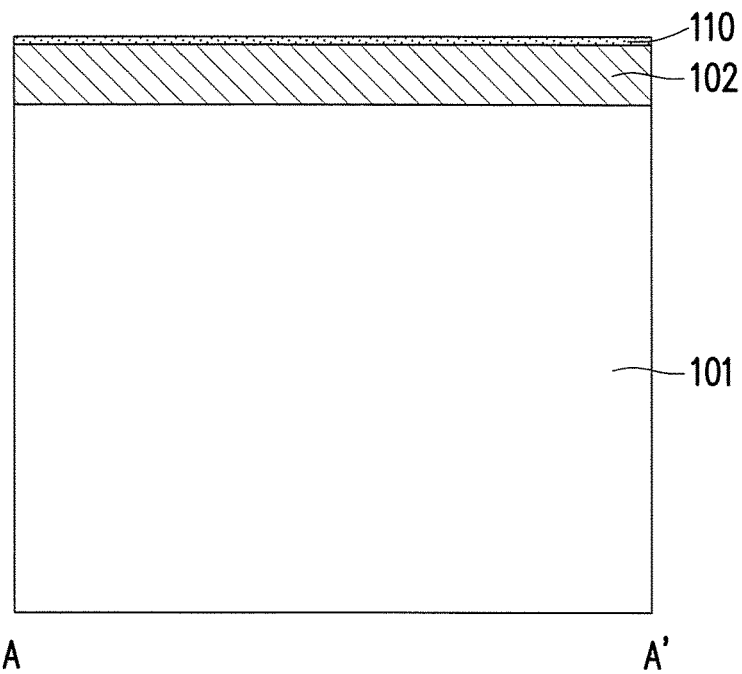
Figure 8C:
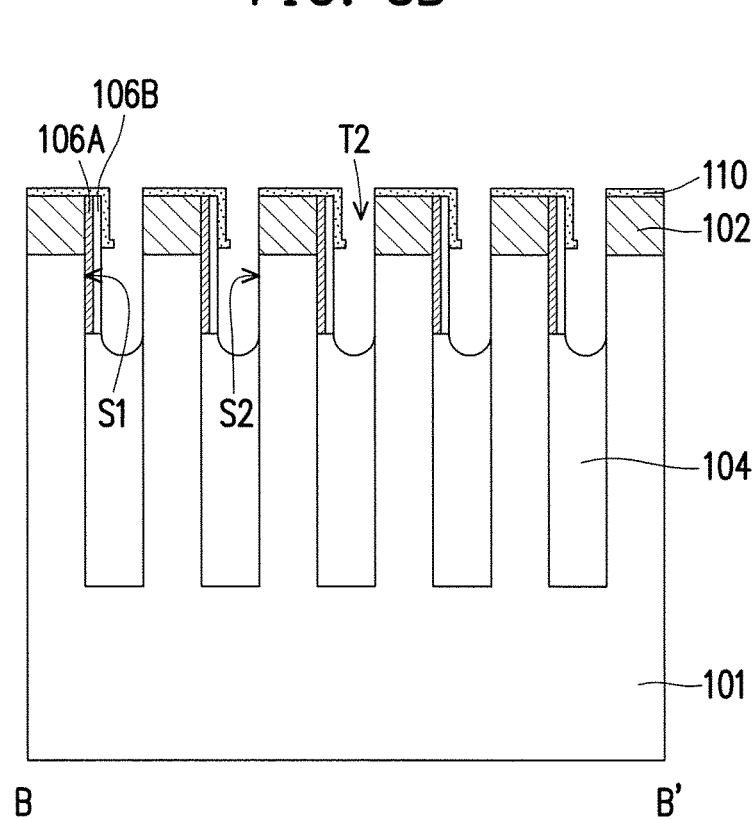

Next, please refer to FIG. 7A to FIG. 7C, the spacers 106B exposed on one of the sidewalls (second sidewall S2) are first removed, for example, through wet etching. Subsequently, as shown in FIG. 8A to FIG. 8C, the liners 106A exposed on one of the sidewalls (second sidewall S2) are then removed, for example, through wet etching. After removing the exposed liners 106A and spacers 106B, the first oxide layers 108 are also removed through another wet etching step. As shown in FIG. 8C, the first oxide layers 108 are removed so that trenches T2 are formed. The liners 106A and the spacers 106B on an opposing sidewall (first sidewall S1) of the trenches T1 are retained.

Figure 9A:
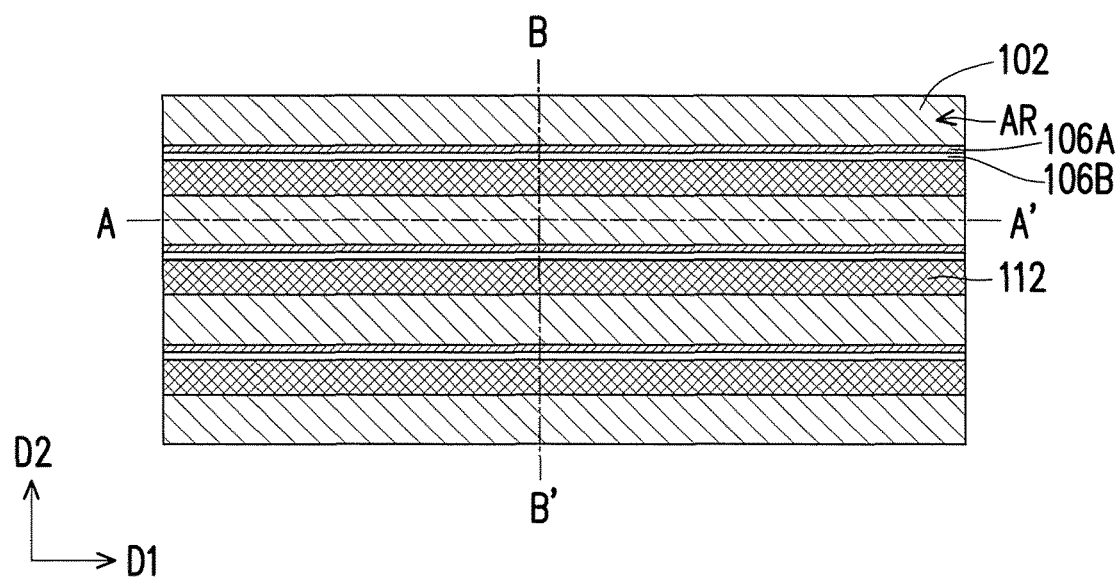
Figure 9B:
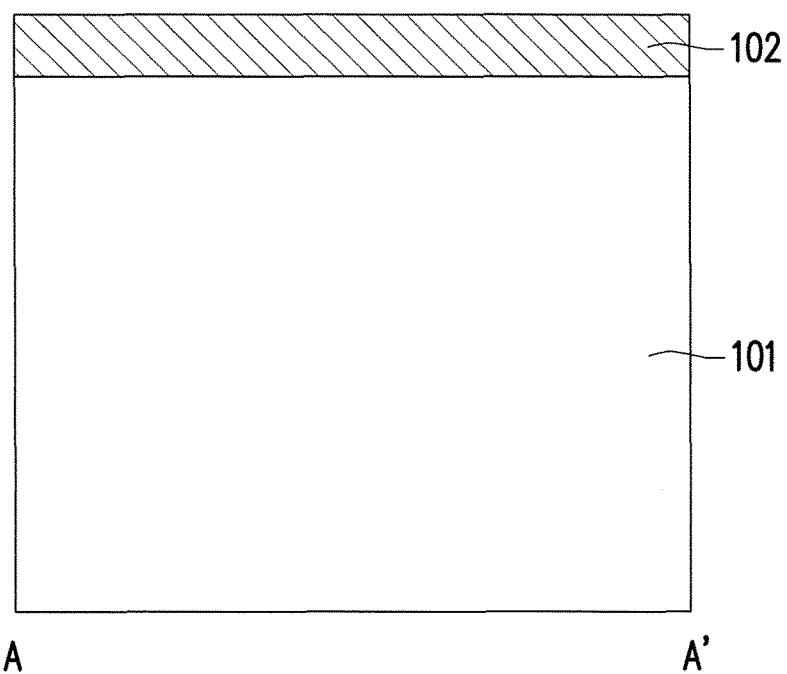
Figure 9C:
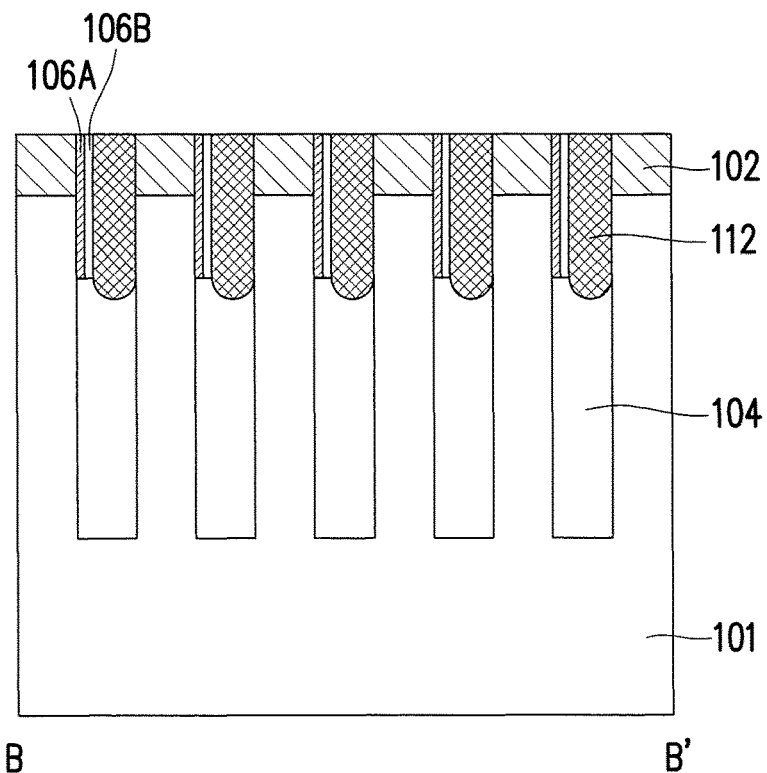
Figure 10A:
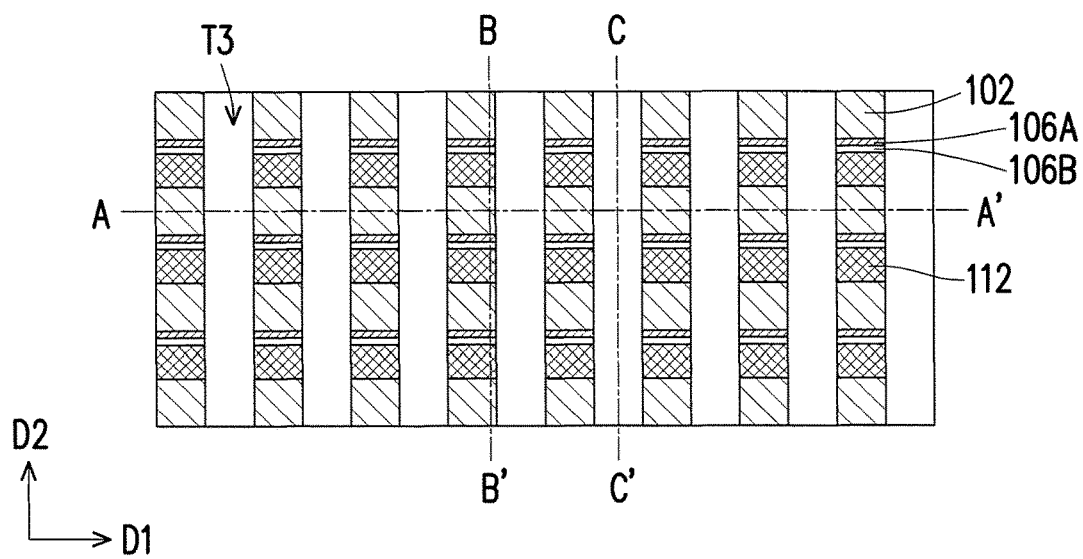
Figure 10B:
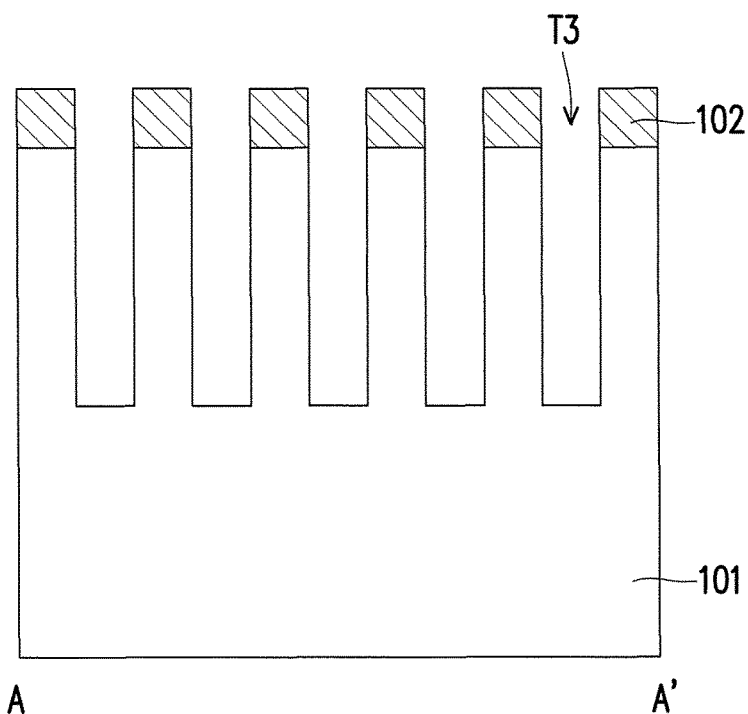
Figure 10C:
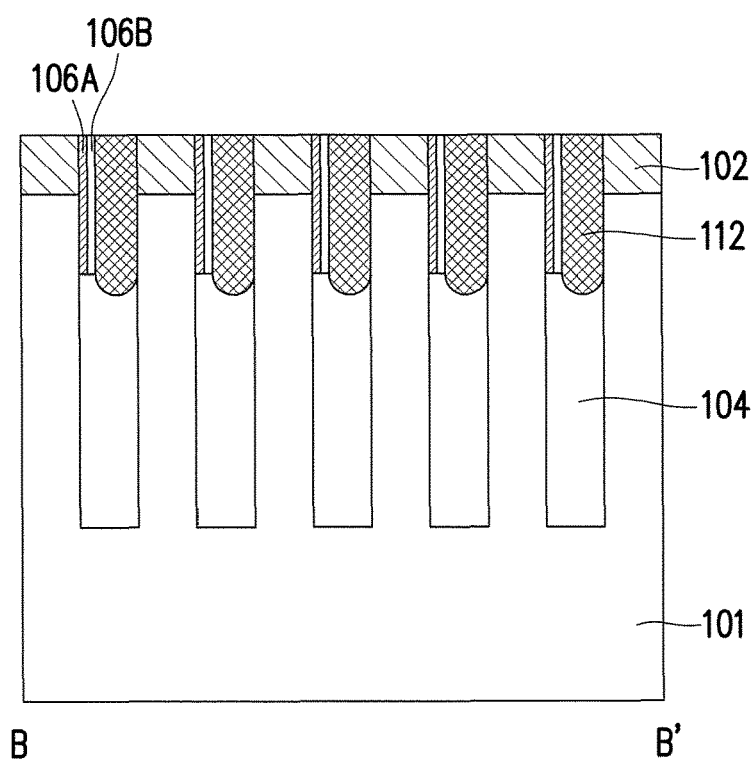
Figure 10D:
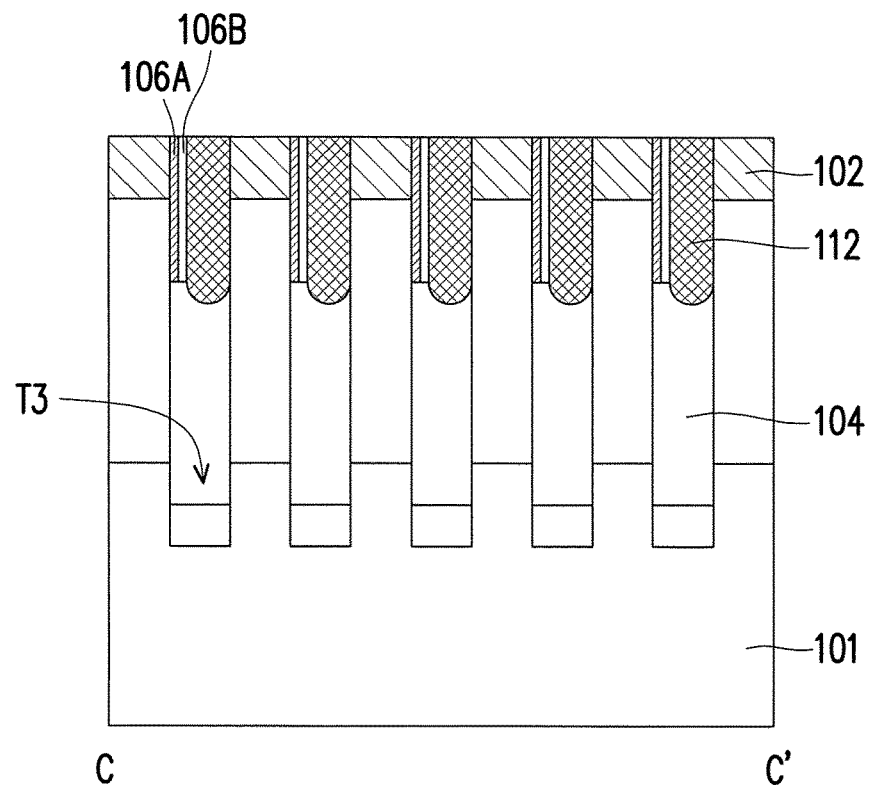

Next, please refer to FIG. 9A to FIG. 9C, after removing the remainder of the mask 110, second oxide layers 112 are formed to fill the trenches T2. A material of the second oxide layers 112 is, for example, silicon oxide. In the present embodiment, one side of the second oxide layers 112 is covered by the liners 106A and spacers 106B formed on the sidewalls (the first sidewalls S1) of the trenches T2, whereas another side of the second oxide layers 112 is in contact with the substrate 101.

Next, please refer to FIG. 10A to FIG. 10D, in order to form word lines 116 (shown in FIG. 1), a plurality of trenches T3 are defined in the substrate 101, wherein the trenches T3 extends along a second direction D2. The second direction D2 being perpendicular to the first direction D1.

Figure 11A:
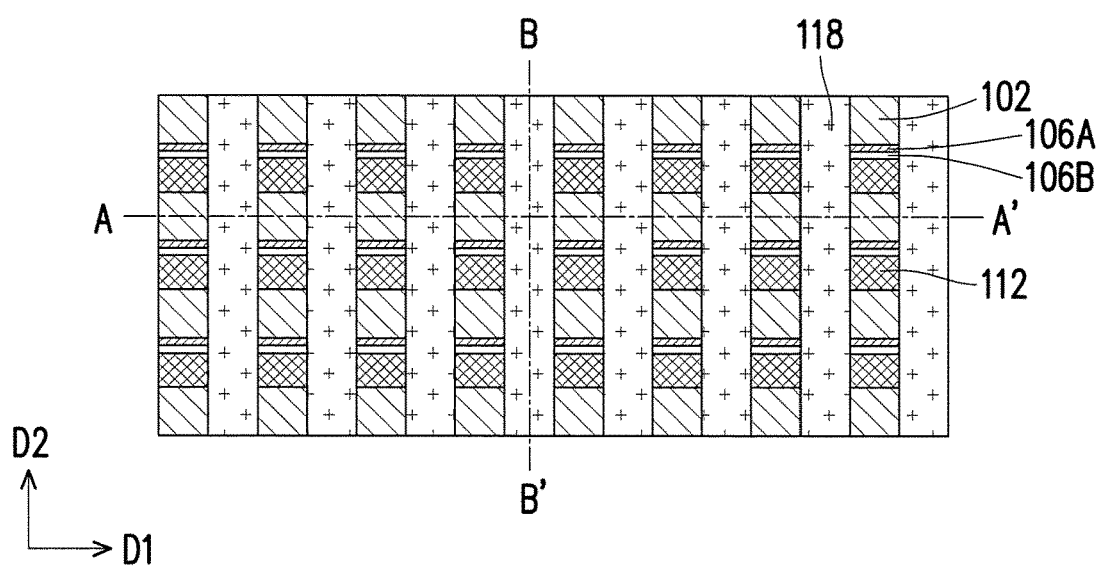
Figure 11B:
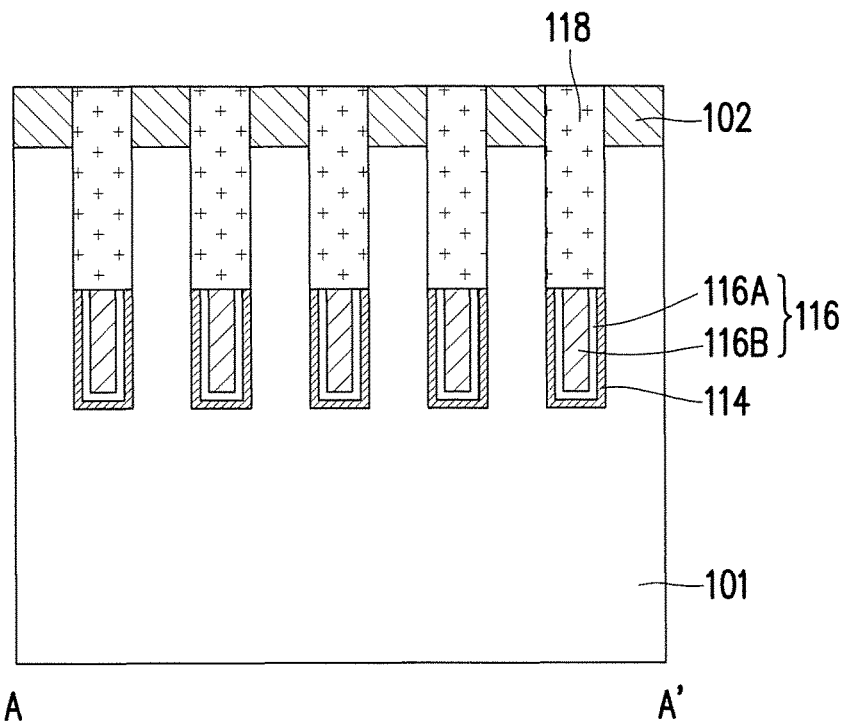
Figure 11C:
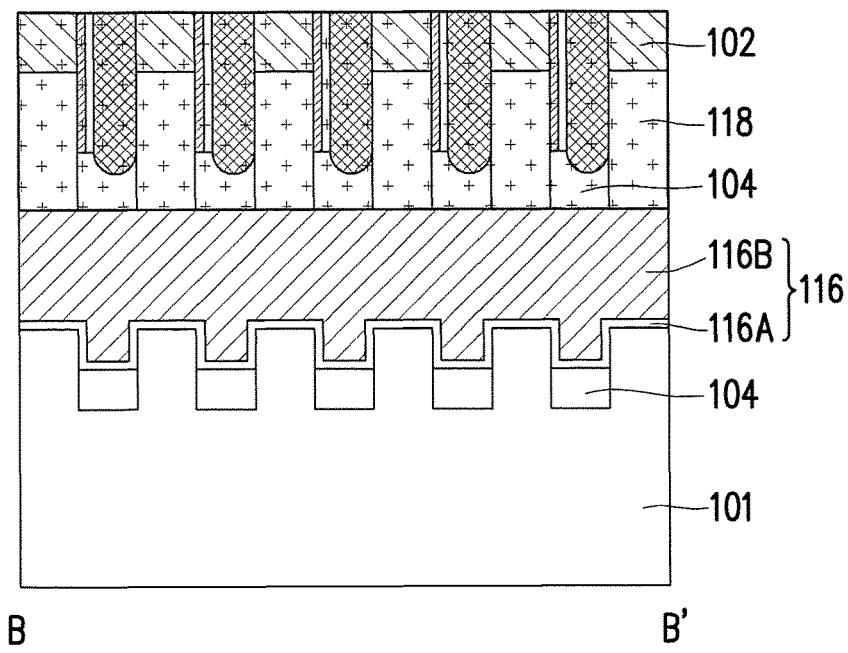
Figure 12A:
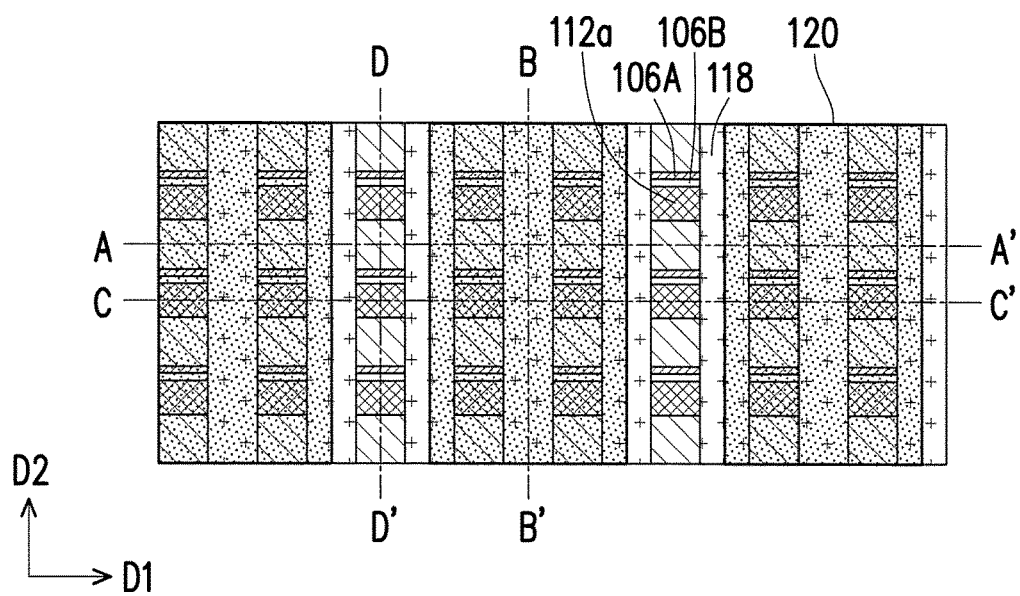
Figure 12B:
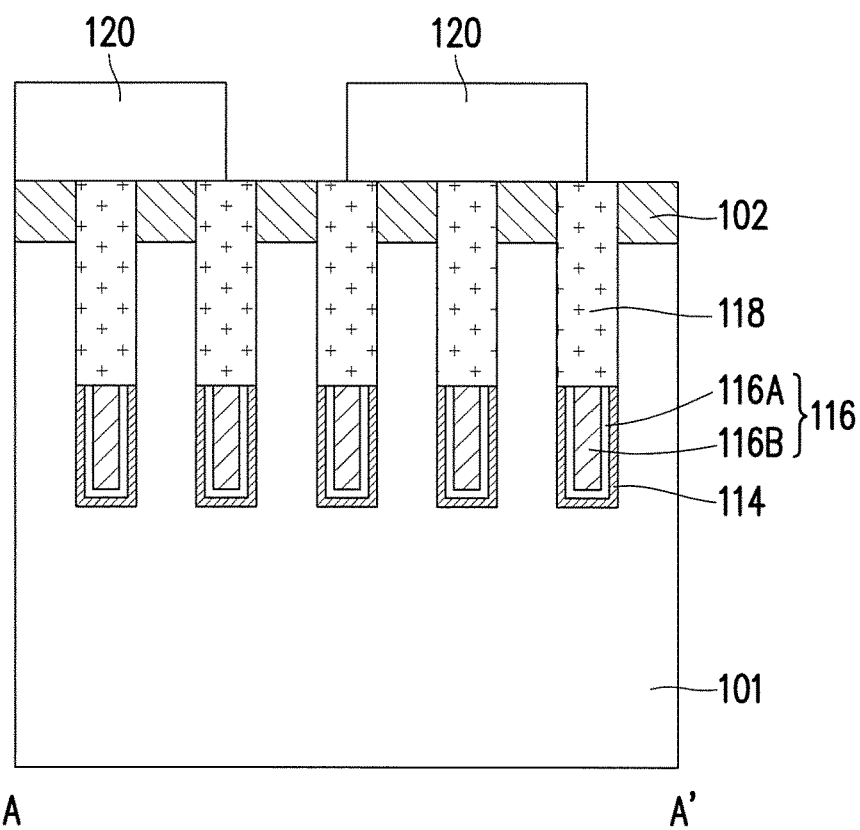
Figures 12C, 12D:
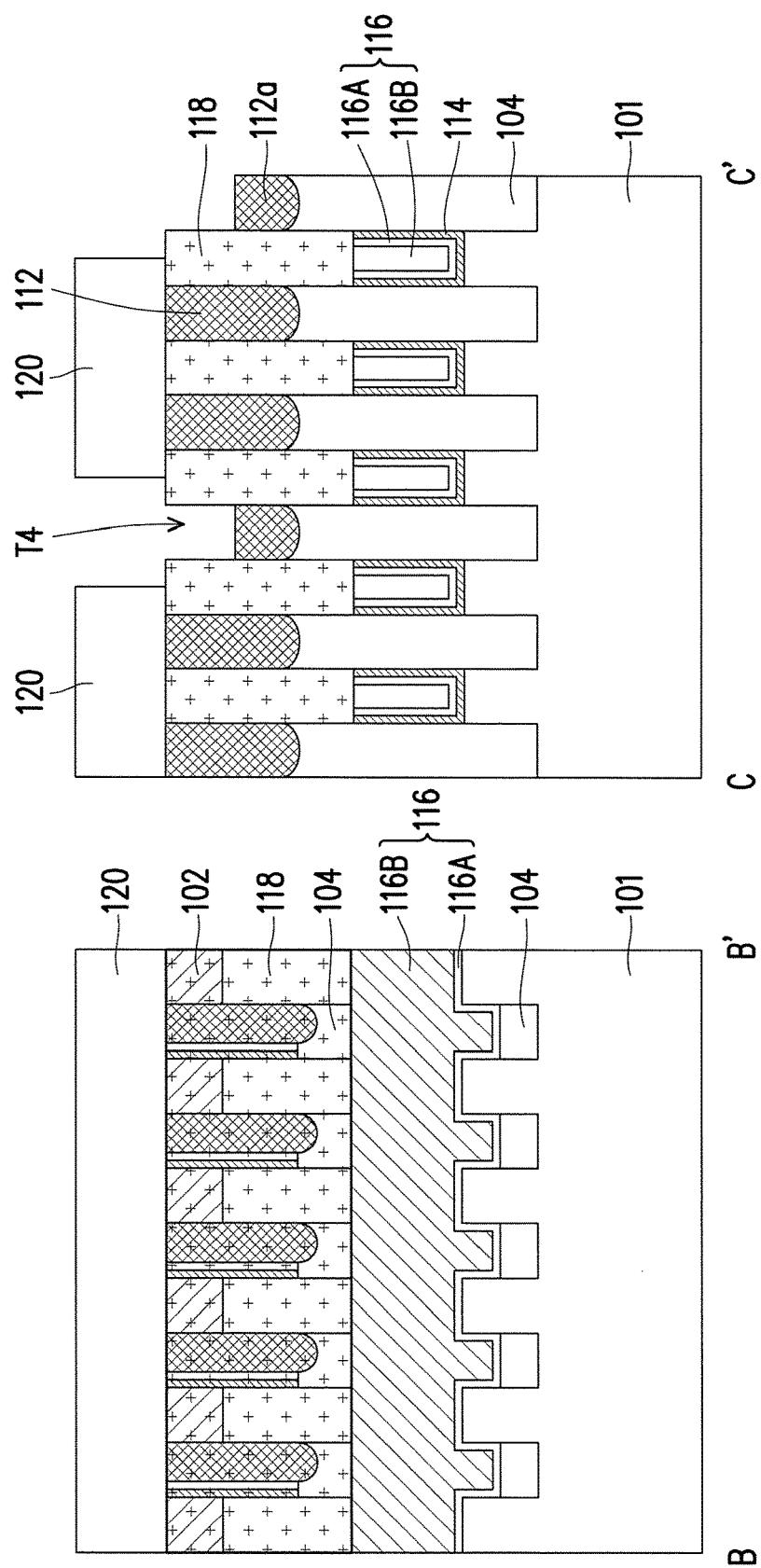
Figure 12E:
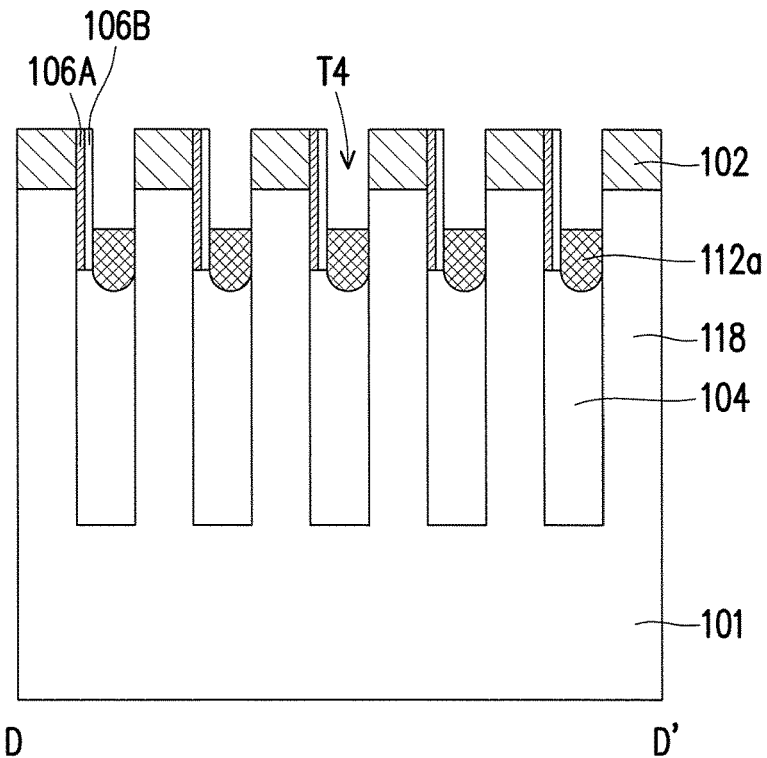
Figure 13A:
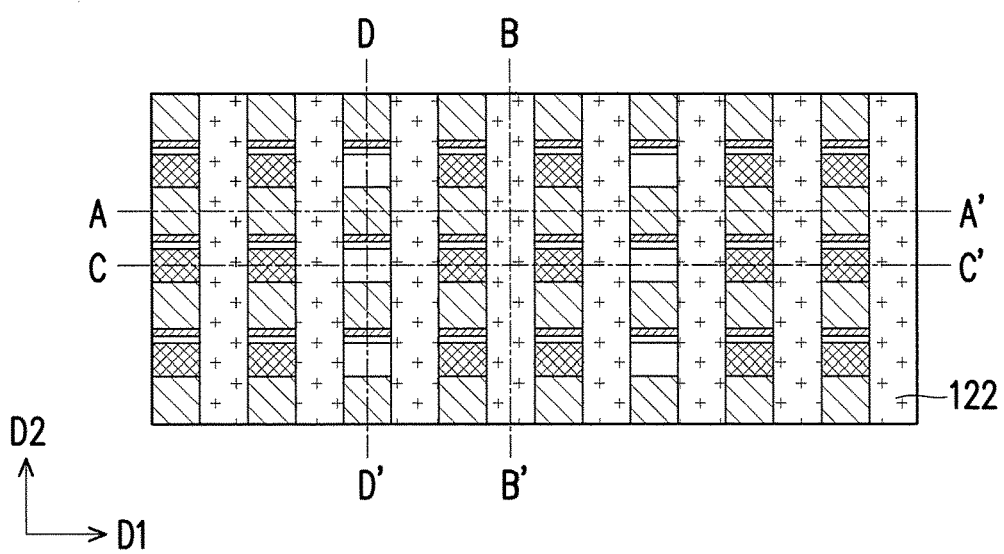
Figure 13B:
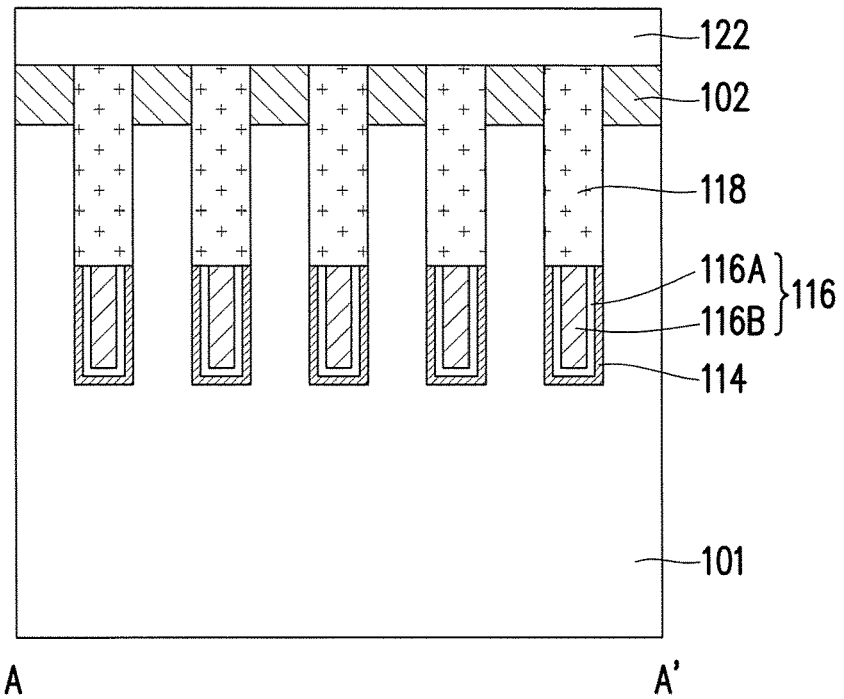
Figure 13C:
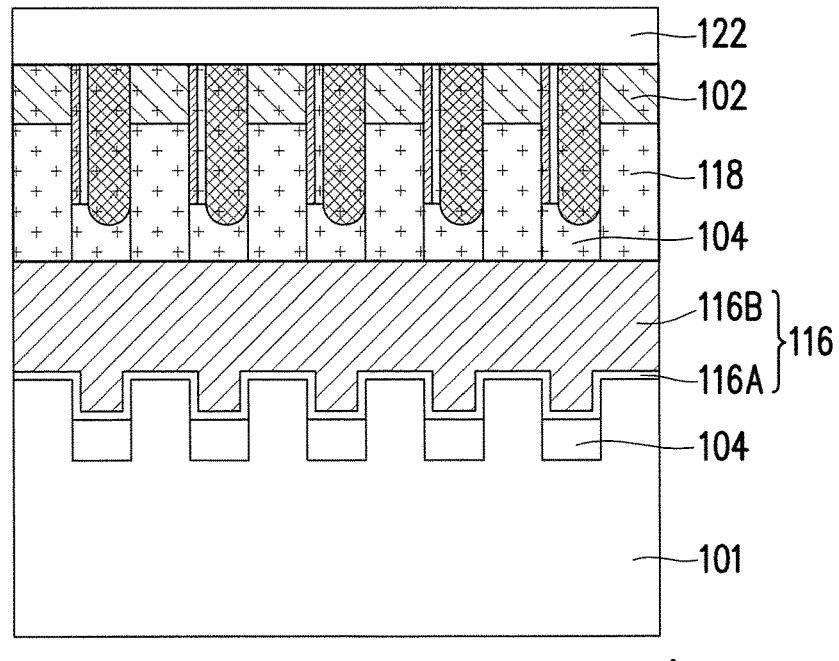
Figure 13D:
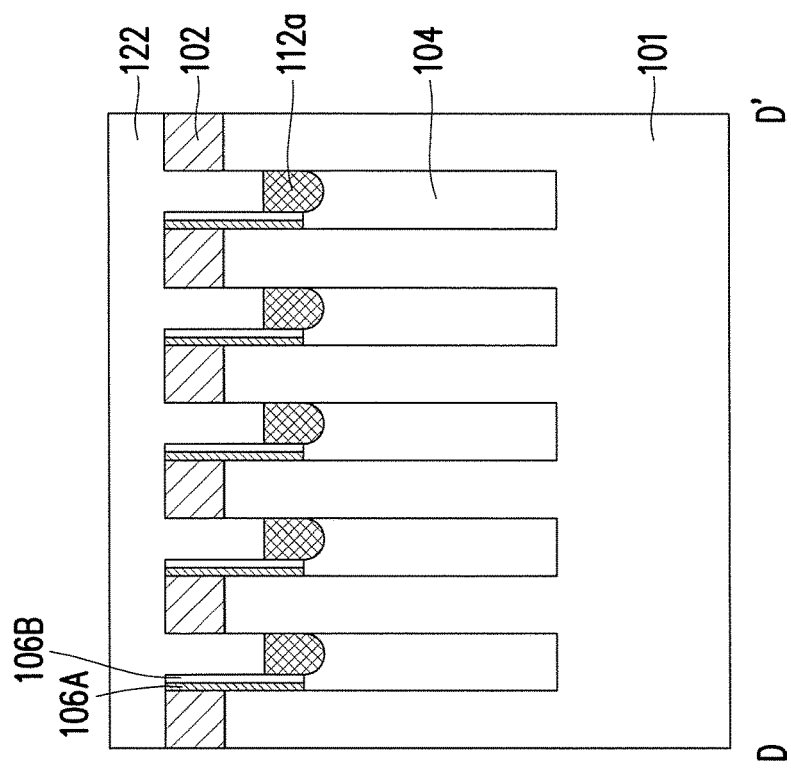
Figure 13E:
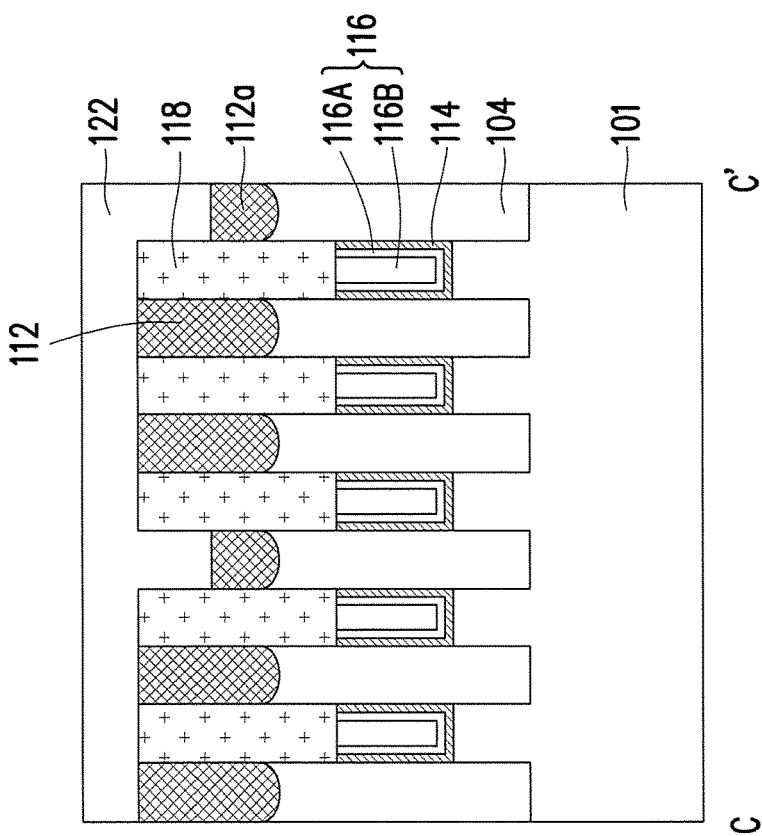

Next, please refer to FIG. 11A to FIG. 11C, gate oxides 114 and a plurality of word lines 116 are formed in the trenches T3. The material of the buried word line 116 is a conductive material, and the conductive material includes metal, metal alloy, metal nitride, or a combination thereof. The metal material is, for instance, tungsten, aluminum, copper, or a combination thereof. The metal alloy is, for instance, copper aluminum alloy. The metal nitride is, for instance, titanium nitride, tantalum nitride, or a combination thereof. In some embodiments, the buried word line 116 is a two-layer structure including a first conductive layer 116A and a second conductive layer 116B.

In the present embodiment, the first conductive layer 116A surrounds and covers the bottom surface and the sidewall of the second conductive layer 116B. The first conductive layer 116A can be used as an adhesive layer or a barrier layer. The material of the first conductive layer 116A is, for instance, metal nitride such as tungsten nitride, titanium nitride or tantalum nitride. The material of the second conductive layer 116B is, for instance, metal or metal alloy such as tungsten, aluminum, copper, or an alloy thereof. The method of forming the word line 116 includes, for instance, forming a first conductive material layer and a second conductive material layer on the substrate 101 using a chemical vapor deposition or a physical vapor deposition process. The first conductive material layer and the second conductive material layer cover the surface of the substrate 101 and is filled in the trench T3. Next, the surface of the substrate 101 and a portion of the first conductive material layer and the second conductive material layer in a portion of the trench T3 are removed by, for instance, an etch-back method to form the first conductive layer 116A and the second conductive layer 116B.

As shown in FIG. 11A to FIG. 11C, after formation of the word line 116, a silicon nitride layer 118 is used to fill into the trenches T3. The silicon nitride layer 118 is, for example formed by overfilling the trenches T3 with silicon nitride so that the silicon nitride covers the mask layer 102. Subsequently, an etch-back process and chemical mechanical polishing step is performed so that a top surface of the silicon nitride layer 118 is level with a top surface of the mask layer 102. The silicon nitride layer 118 is formed in the trenches T3 to cover the word lines 116.

Next, please refer to FIG. 12A to FIG. 12E, after forming the silicon nitride layer 118, a patterned mask layer 120 is formed to cover portions of the silicon nitride layer 118, and to cover portions of the mask layer 102 and second oxide layers 112. The patterned mask layer 120 is, for example, a patterned photoresist layer. In the embodiment, portions of the second oxide layers 112 uncovered by the photoresist 120 are etched to form trenches T4 (See FIG. 12D and FIG. 12E). In the embodiment, the trenches T4 are formed through wet etching. After etching, etched second oxide layers 112a are exposed by the trenches T4.

Next, please refer to FIG. 13A to FIG. 13E, a doped polysilicon layer 122 is formed in the trenches T4. In addition, the doped polysilicon layer 122 cover top surfaces of the silicon nitride layer 118, the mask layer 102 and the second oxide layers 112. In the embodiment, the doped polysilicon layer 122 is, for example, a p-doped polysilicon layer. The doped polysilicon layer 122 is used to form bit line contacts in a subsequent step.

Next, please refer to FIG. 14A to FIG. 14E, the doped polysilicon layer 122 is etched through an etch-back process to form a plurality of bit line contacts 122a. The plurality of bit line contacts 122a are located above the etched second oxide layers 112a and above the isolation structures 104. Moreover, each of the bit line contacts 122a have a diffusion region that defines a bit line side contact 122b. The bit line side contacts 122b are N-regions processed by P diffusion.

Figure 14A:
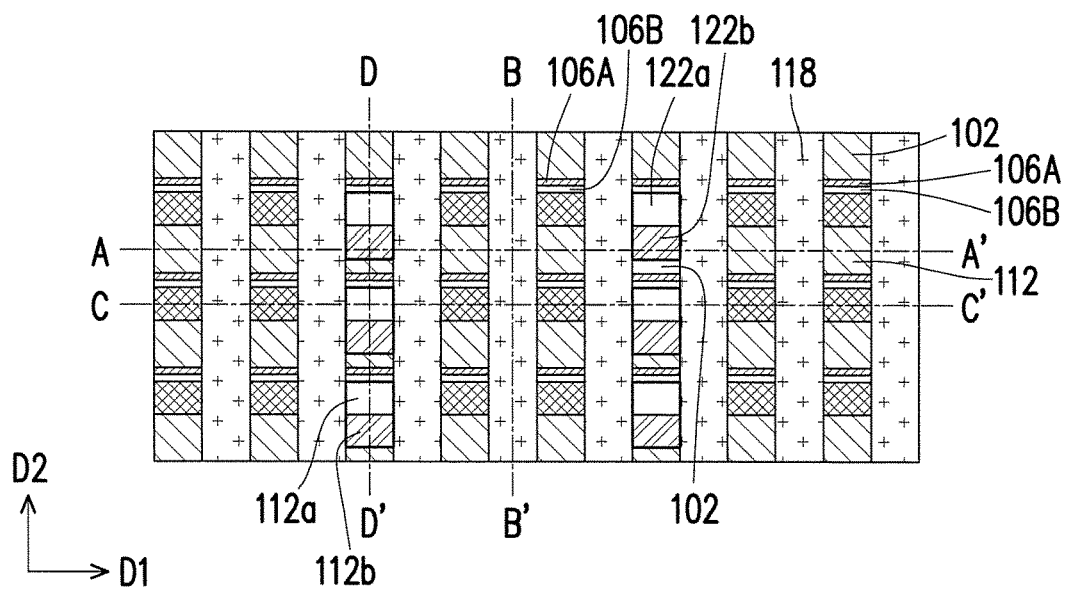
Figure 14B:
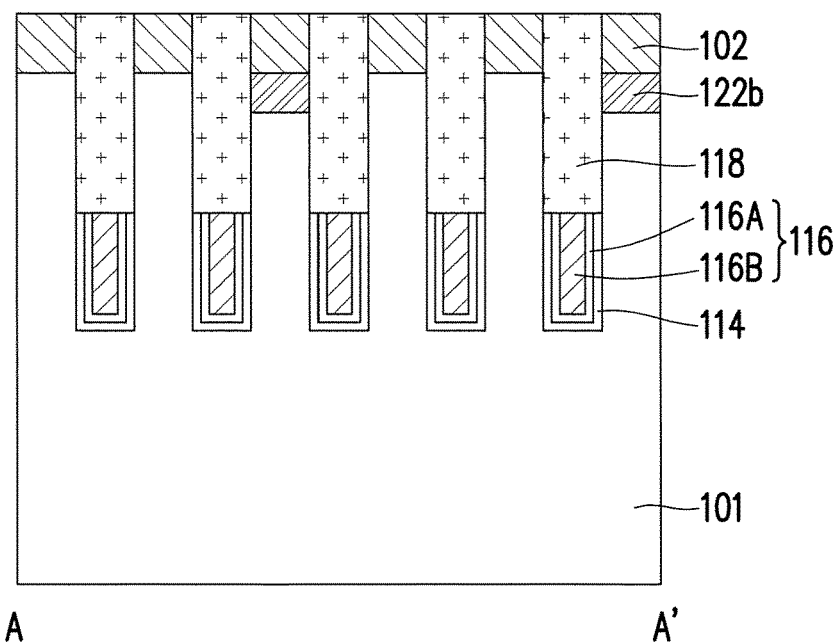
Figure 14D:
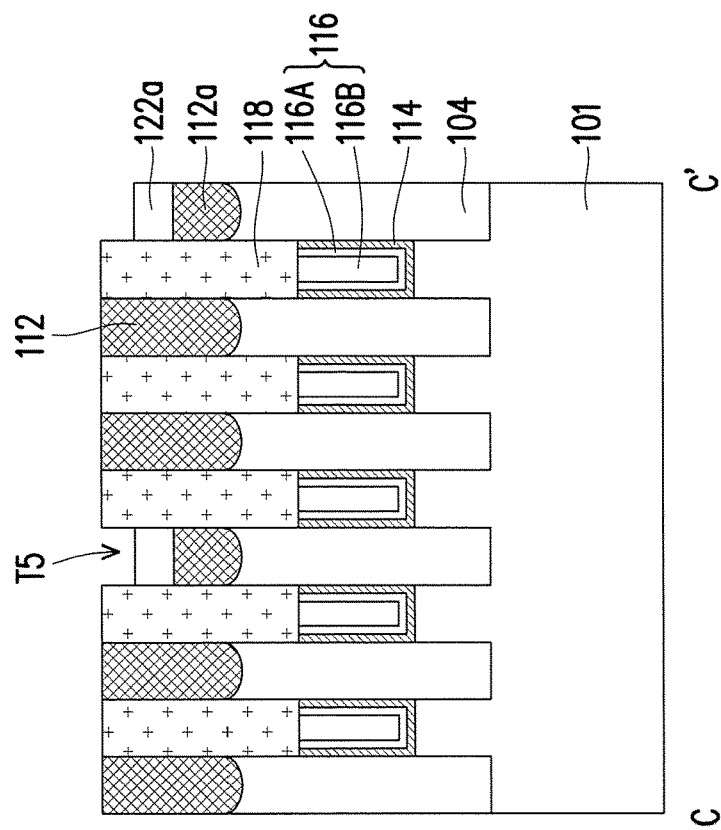
Figure 14C:
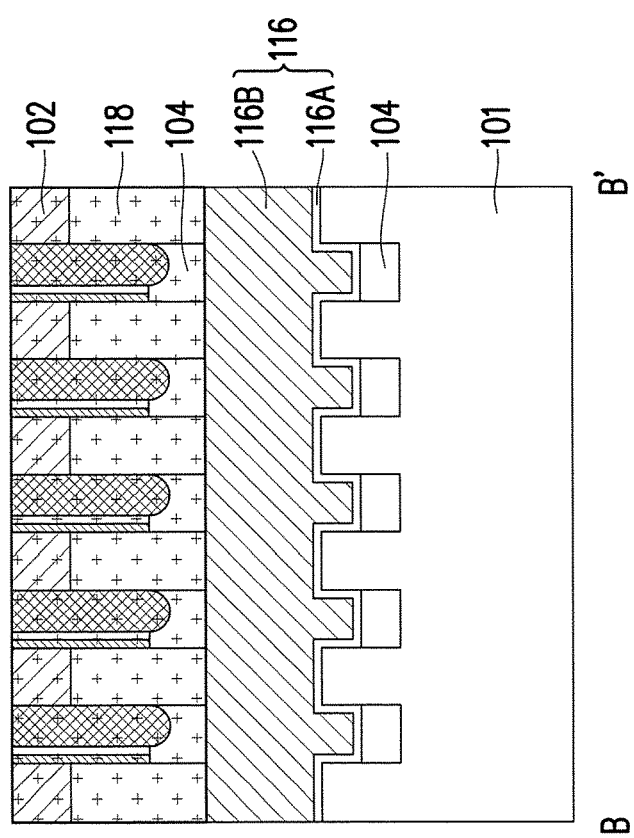
Figure 14E:
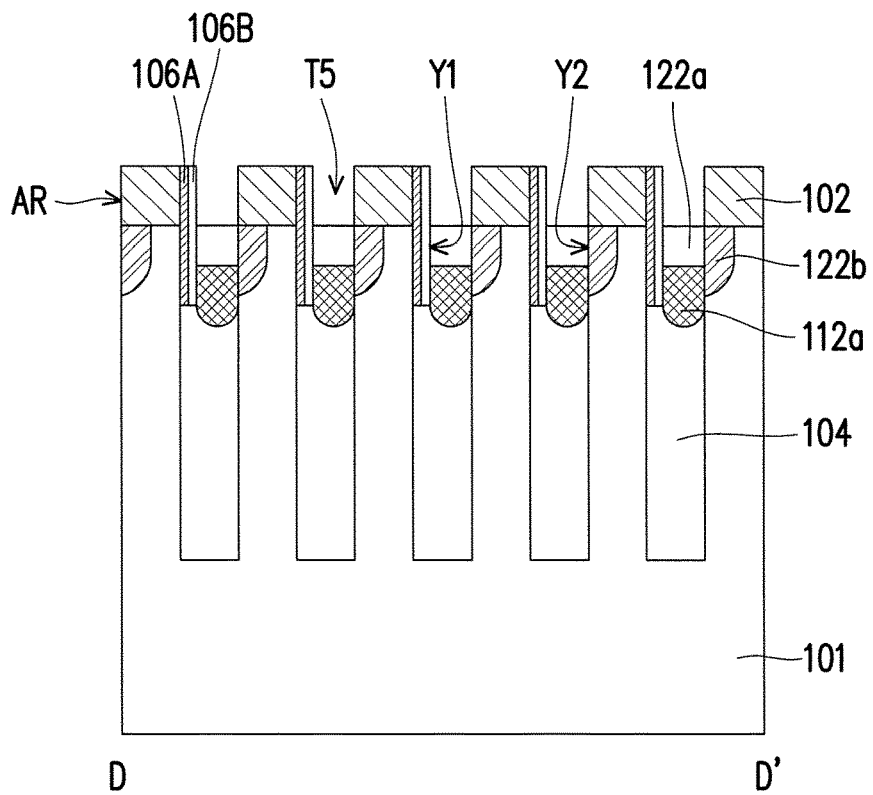
Figure 15A:
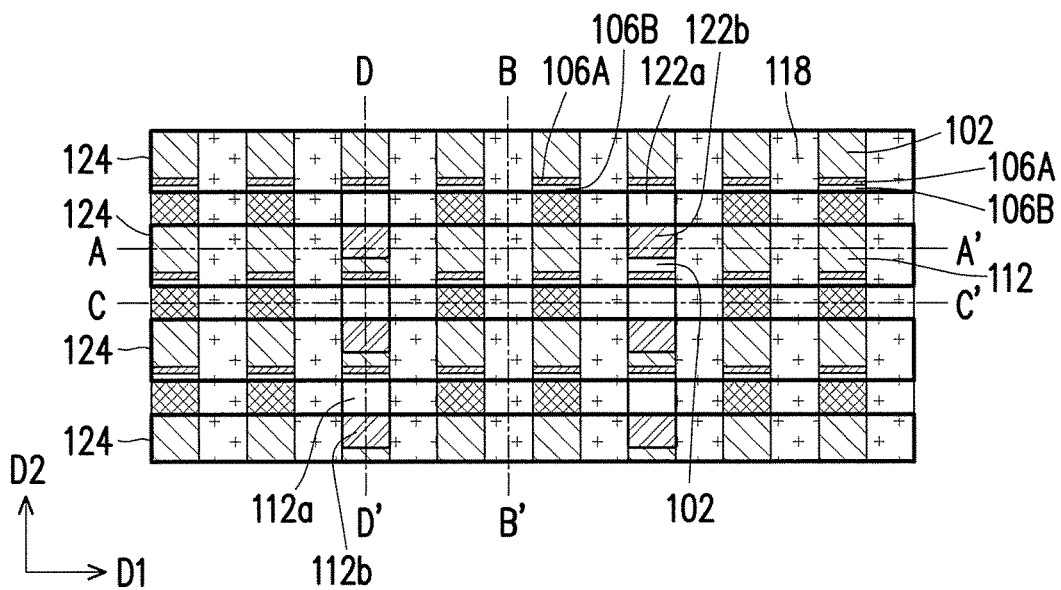
Figures 15B, 15C:
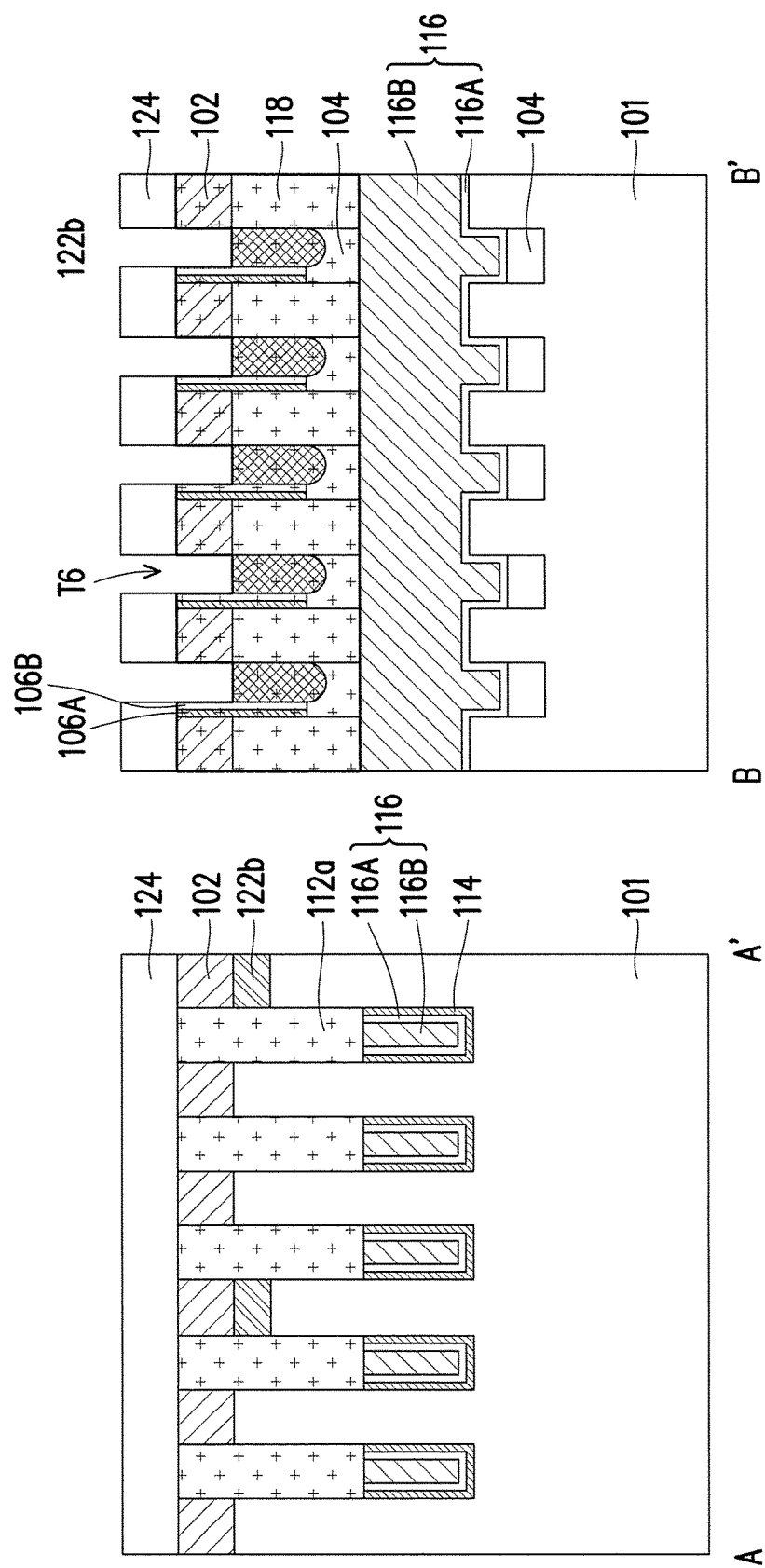
Figure 15E:
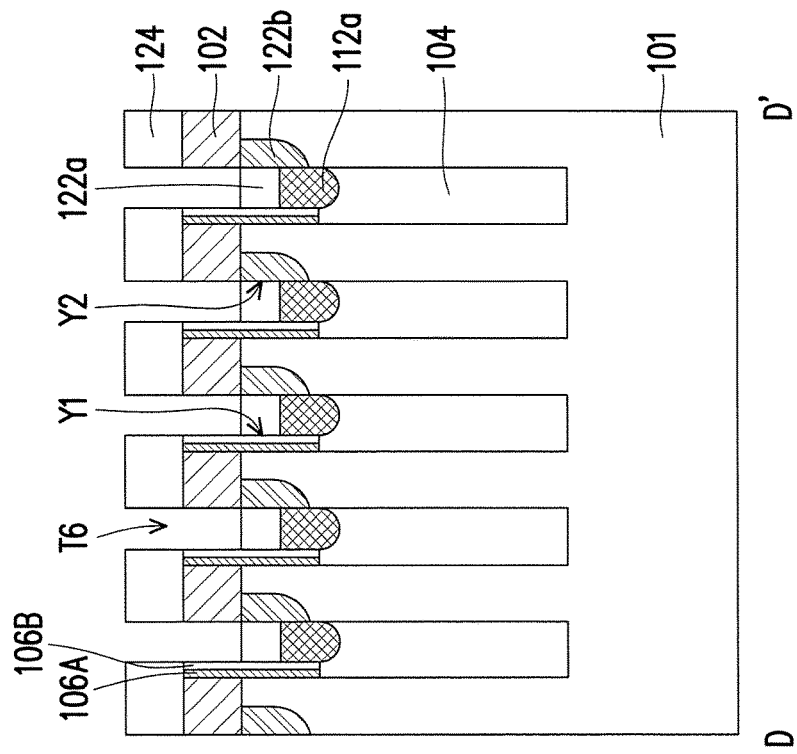
Figure 15D:
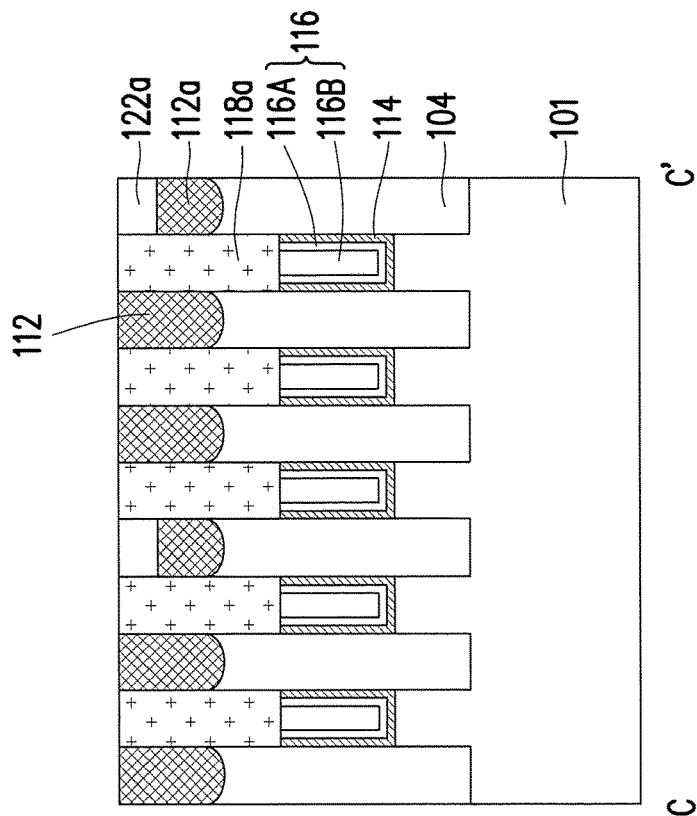
Figure 16A:
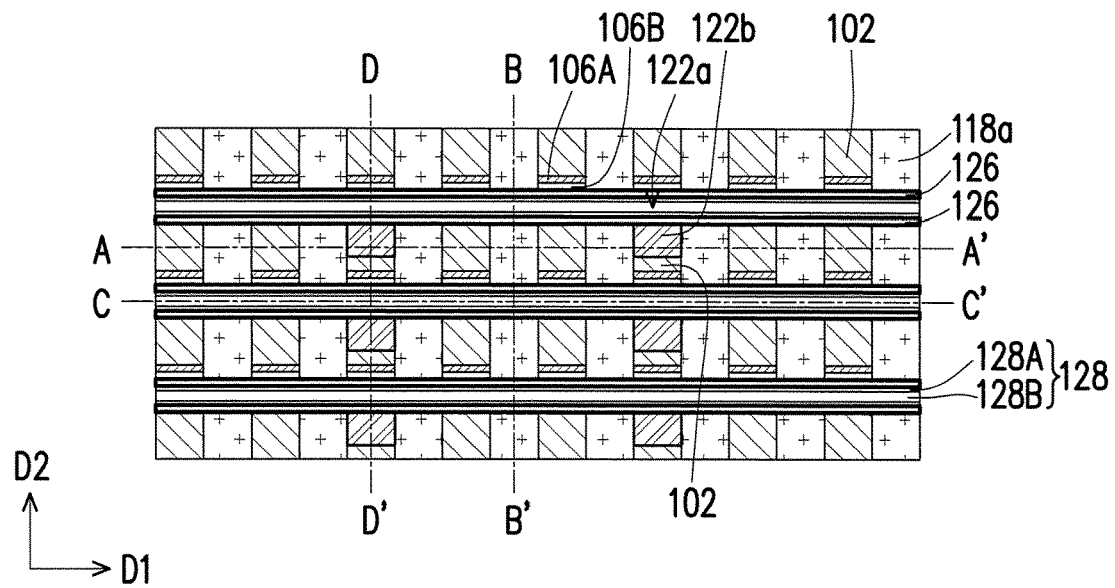
Figure 16B:
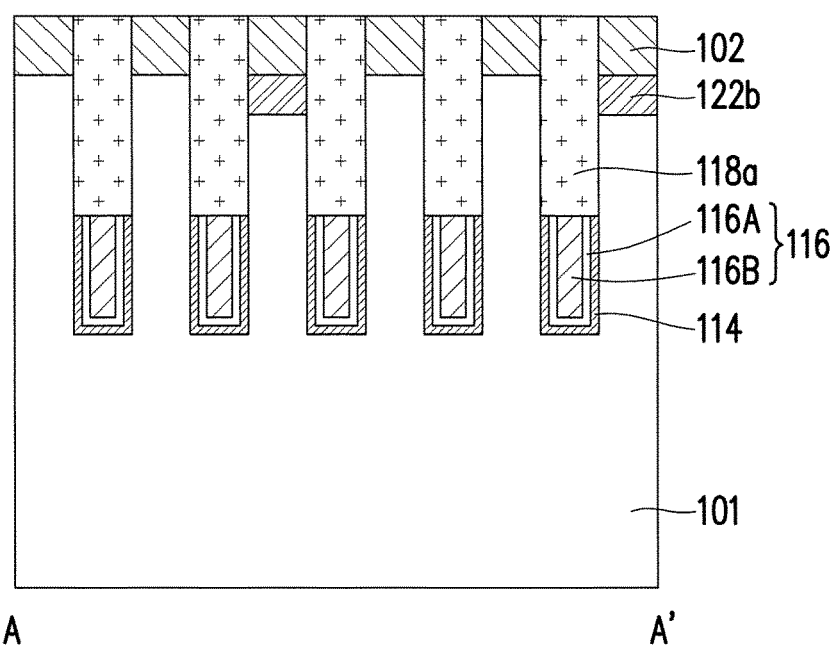
Figure 16E:
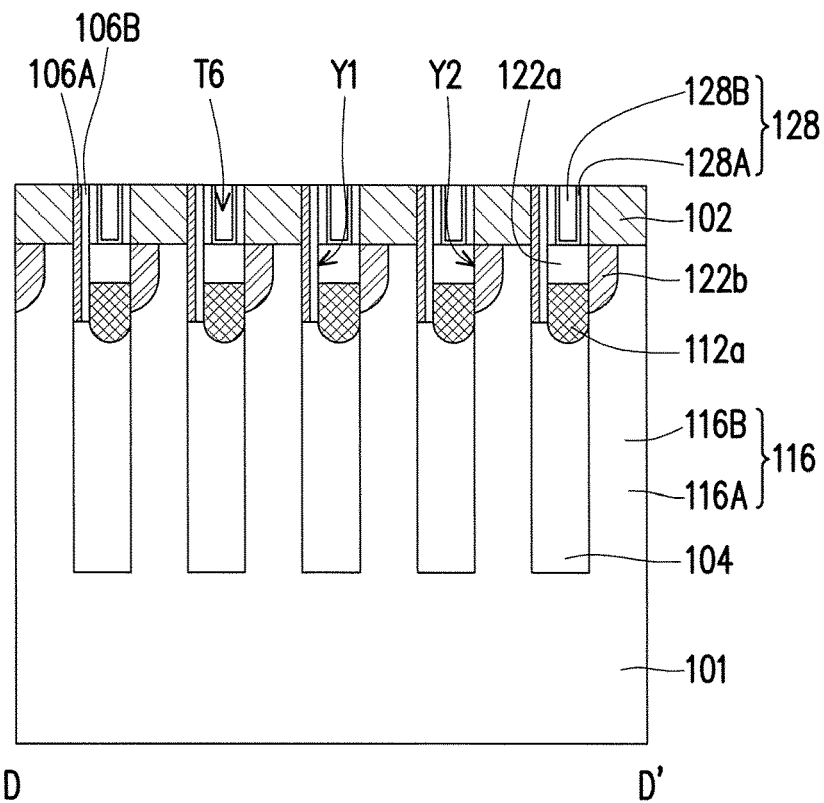
Figure 17A:
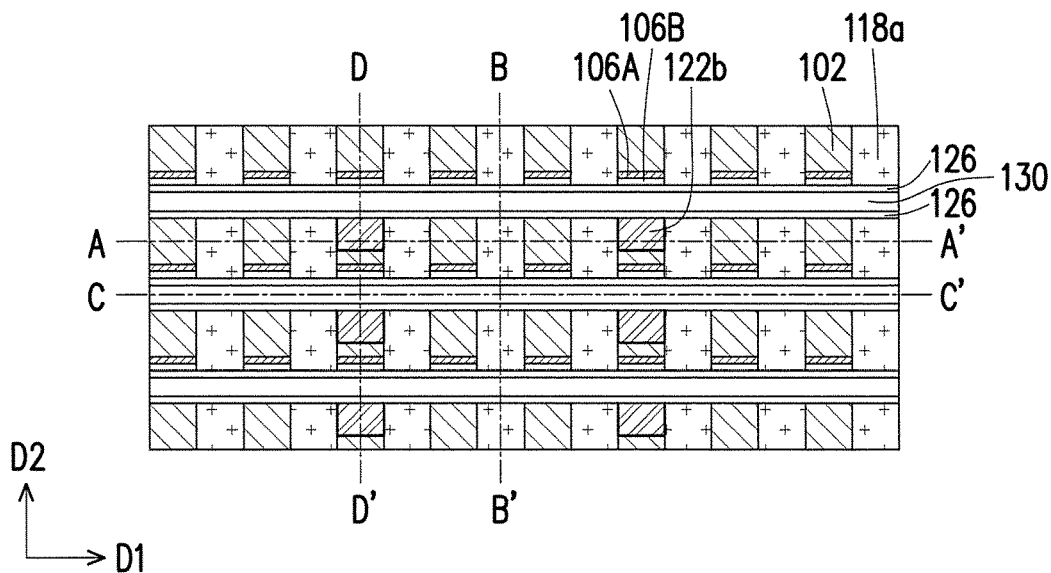
Figure 17B:
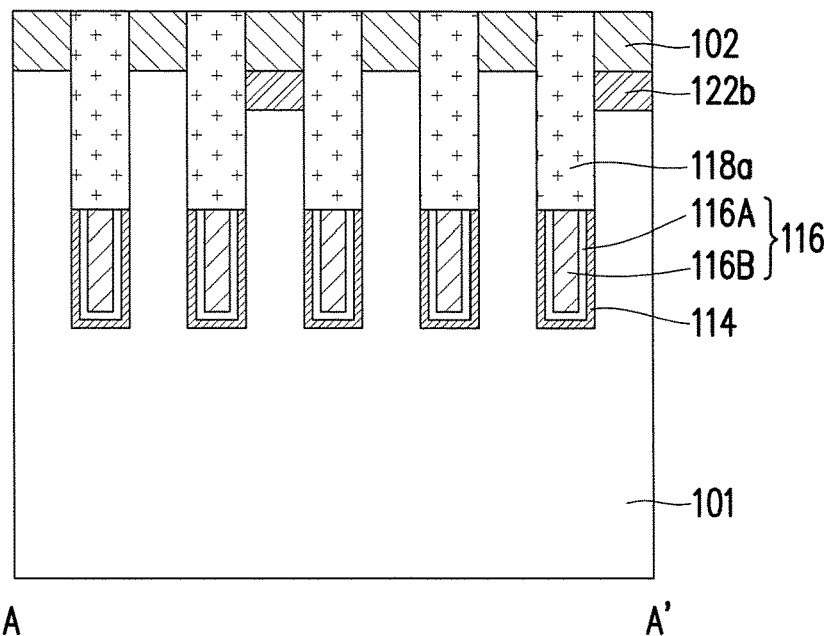
Figure 17C:
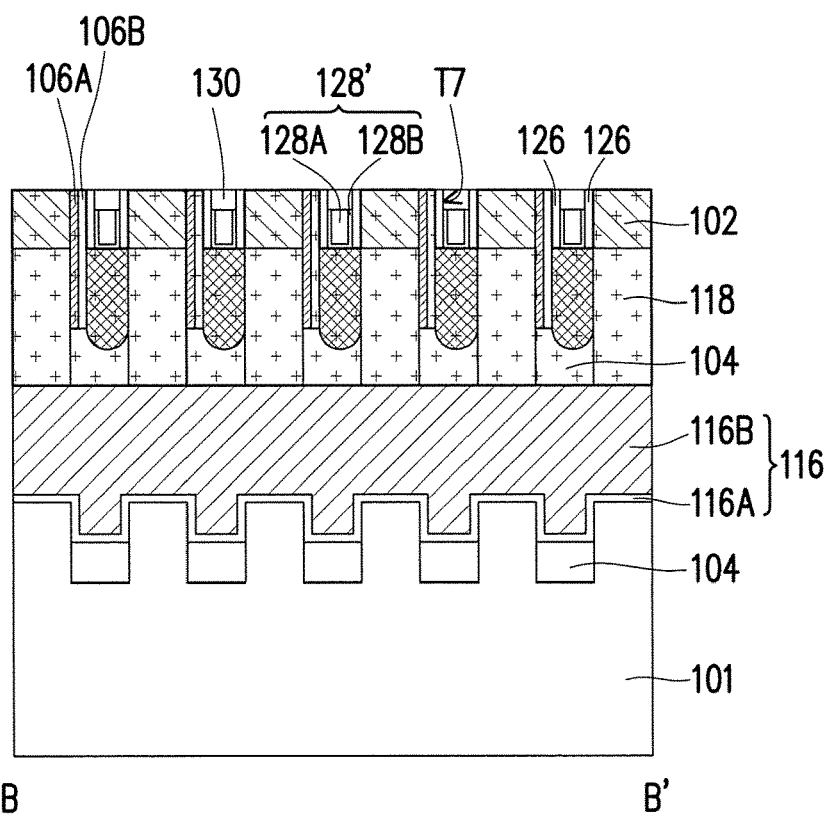
Figure 17D:
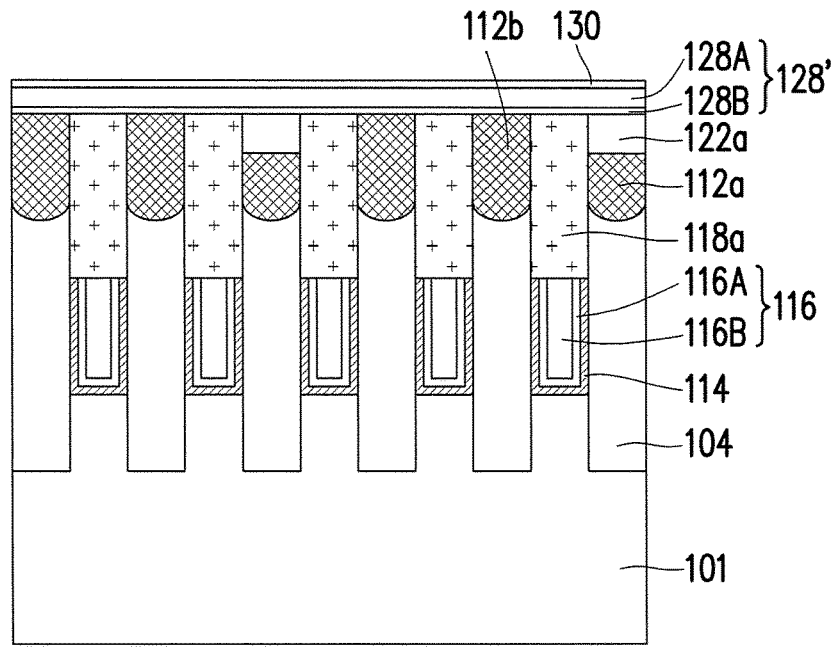
Figure 17E:
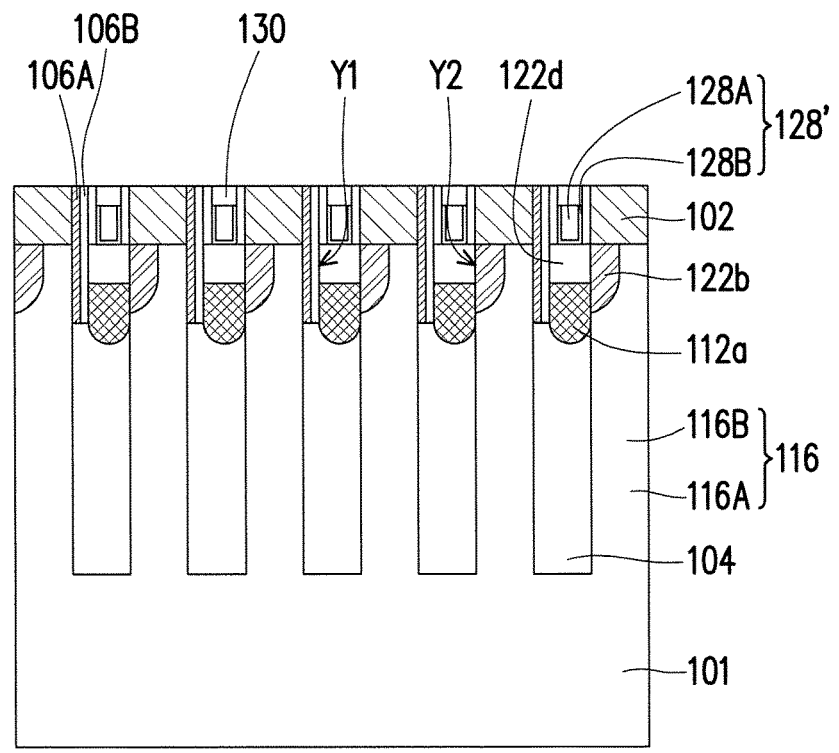
Figure 18A:
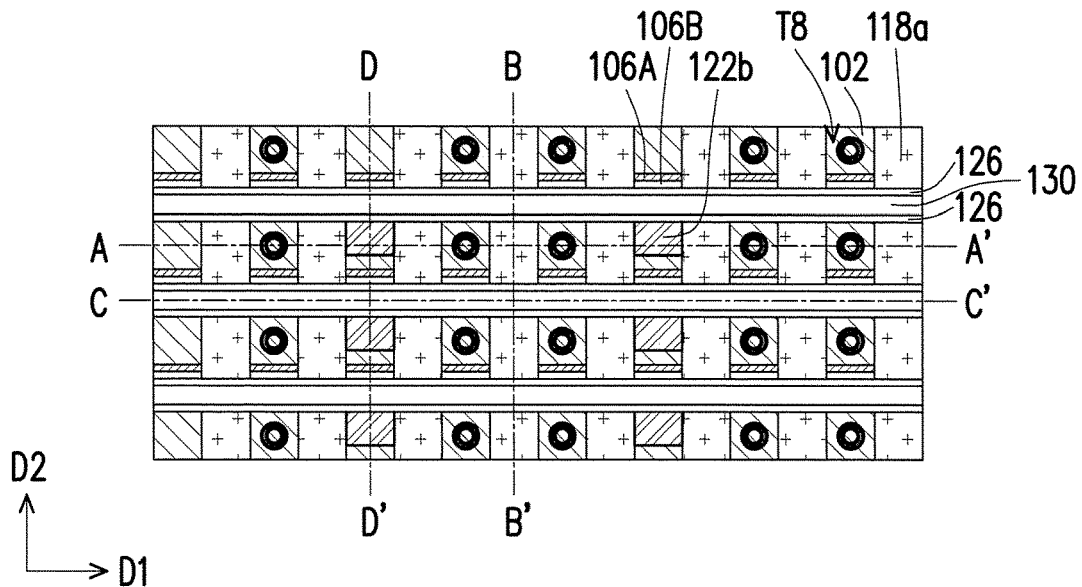
Figure 18B:
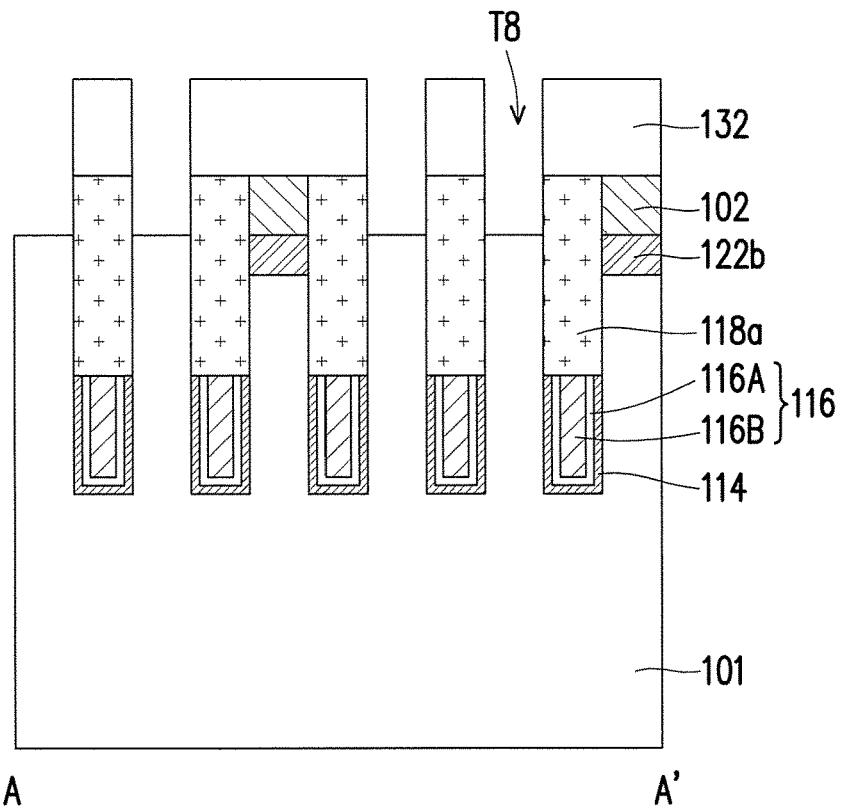
Figure 18E:
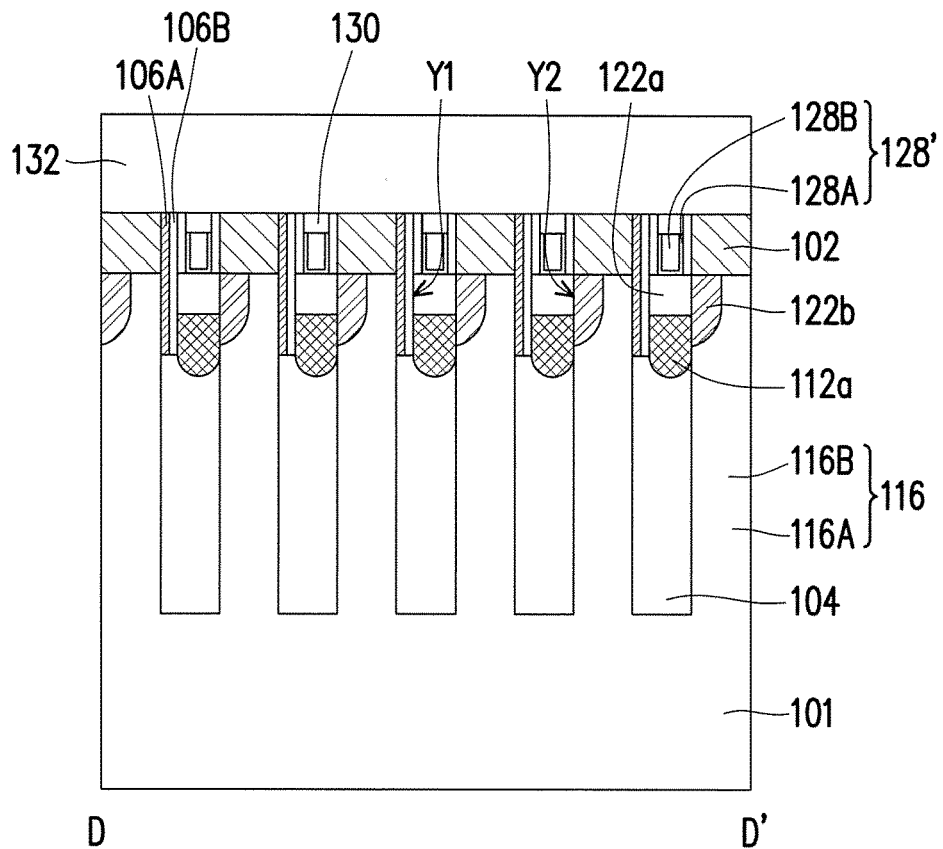
Figure 19A:
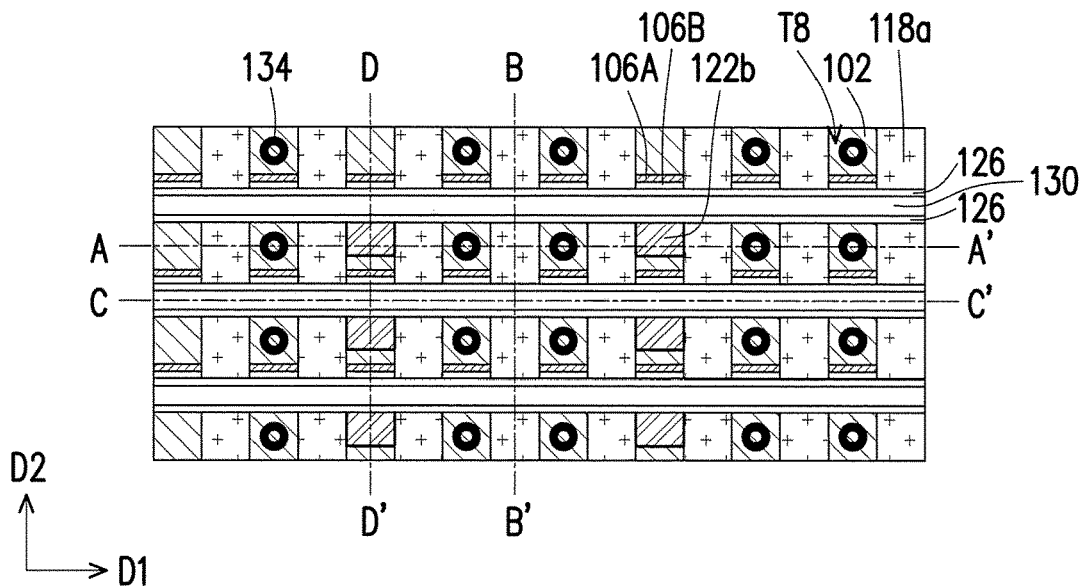
Figure 19C:
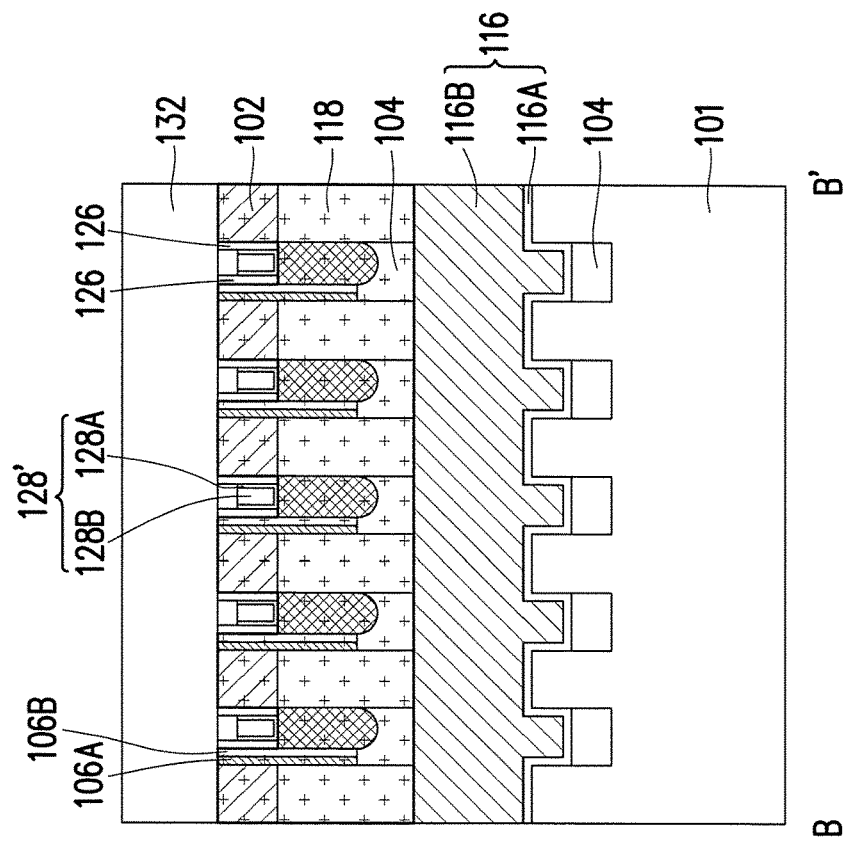
Figure 19B:
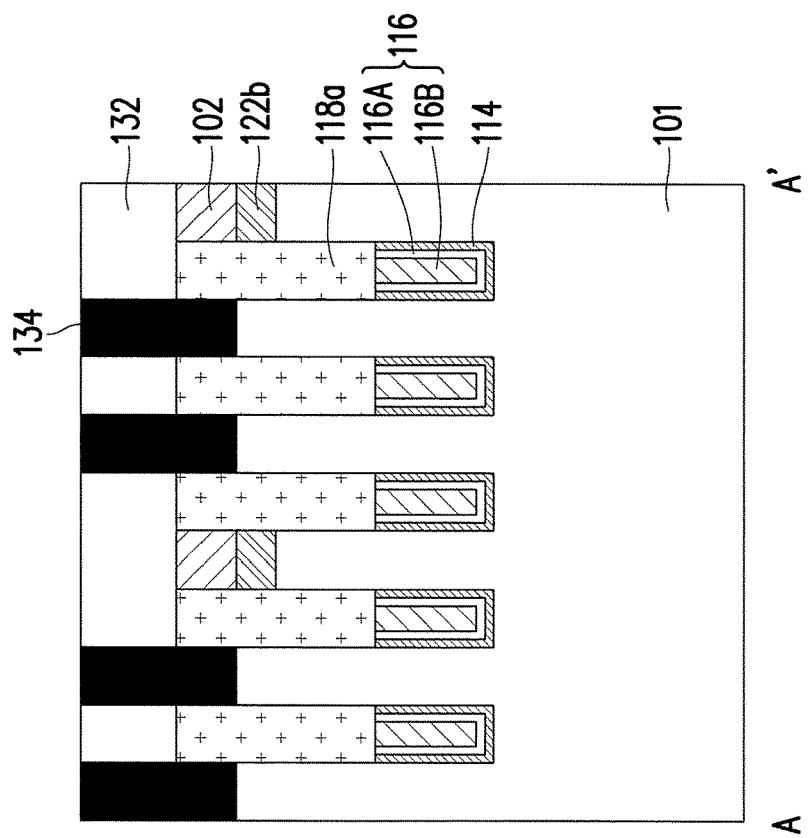
Figure 19D:
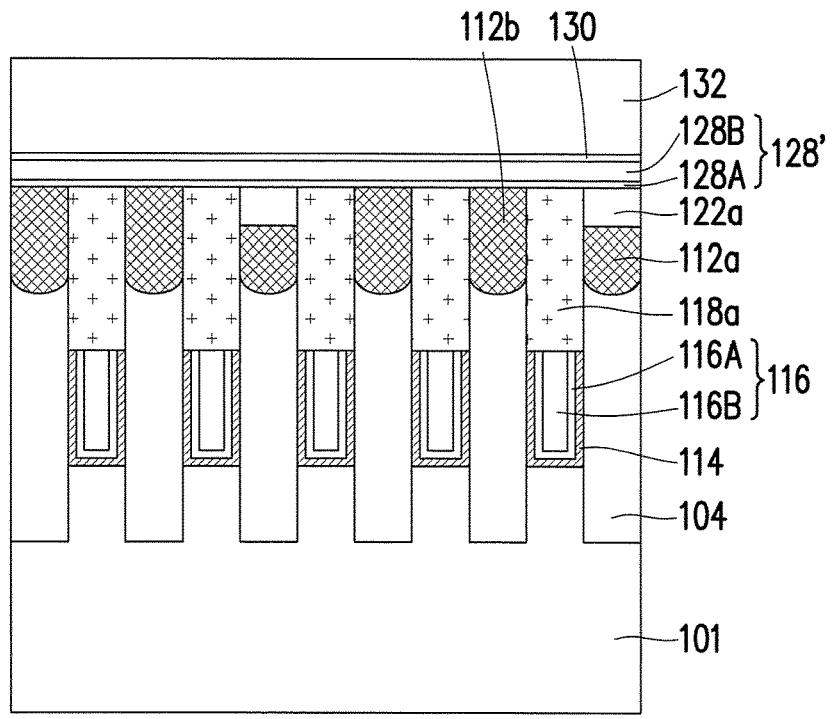
Figure 19E:
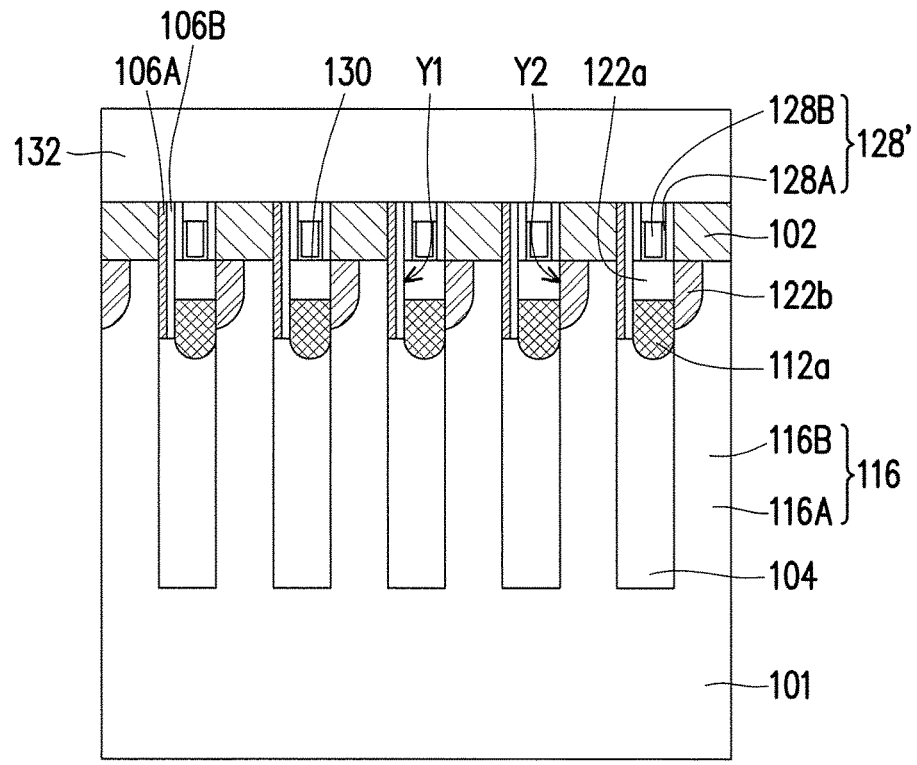

In the present embodiment, the bit line contacts 122a are exposed by trenches T5, which are formed during the etch-back process (see FIG. 14D and FIG. 14E). Furthermore, liners 106A and spacers 106B are covering only one side of each of the bit line contacts 122a, whereas the liners 106A and spacers 106B are located opposite to a side where the bit line side contact 122b is defined (see FIG. 14E). That is, since the liners 106A and spacers 106B are covering only one side Y1 of the bit line contacts 122a, the bit line side contacts 122b may be formed on another side Y2 of the bit line contacts 122a through diffusion. Additionally, the bit line contacts 122a are diffused to a position that is located below the mask layer 102. Moreover, a top surface of the bit line contacts 122a is at a same level with a bottom surface of the mask layer 102 (active region AR).

Next, please refer to FIG. 15A to FIG. 15E, after forming the bit line contacts 122a and bit line side contacts 122b, a patterned mask layer 124 is formed to cover the mask layer 102 and formed to cover portions of the silicon nitride layer 118. Other portions of the silicon nitride layer 118 and portions of the second oxide layers 112 uncovered by the patterned mask layer 124 are etched to form trenches T6 (see FIGS. 15C and 15E). In the embodiment, the silicon nitride layer 118 are etched to form etched silicon nitride layer 118a, so that top surfaces of the etched silicon nitride layers 118a are coplanar with top surfaces of the second oxide layers 112 and the bit line contacts 122a (see FIG. 15D). The trenches T6 formed in this step are used to form bit lines with damascene interconnect technology in subsequent steps.

Next, please refer to FIG. 16A to FIG. 16E, the patterned mask layer 124 is stripped off, and bit line sidewalls 126 are formed inside the trenches T6 to cover two opposing sidewalls of the trenches T6. The bit line sidewalls 126 are, for example, made of silicon nitride. After forming the bit line sidewalls 126, conductive materials 128 are formed in the trenches T6 in between the bit line sidewalls. That is, the conductive materials 128 are isolated by the bit line sidewalls 126. In the present embodiment, the conductive materials 128 are used to form bit lines. The material of the conductive materials 128 includes metal, metal alloy, metal nitride, or a combination thereof. The metal material is, for instance, tungsten, aluminum, copper, or a combination thereof. The metal alloy is, for instance, copper aluminum alloy. The metal nitride is, for instance, tungsten nitride, titanium nitride, tantalum nitride, or a combination thereof.

In the present embodiment, the conductive materials 128 is a two-layer structure including a first conductive layer 128A and a second conductive layer 128B. The first conductive layer 128A surrounds and covers the bottom surface and the sidewall of the second conductive layer 128B. The first conductive layer 128A can be used as an adhesive layer or a barrier layer. The material of the first conductive layer 128A is, for instance, metals such as titanium, tungsten, or metal nitride such as titanium nitride or tantalum nitride. The material of the second conductive layer 128B is, for instance, metal or metal alloy such as tungsten, aluminum, copper, or an alloy thereof.

Next, please refer to FIG. 17A to FIG. 17E, the conductive materials 128 are etched to form a plurality of buried bit lines 128'. Furthermore, trenches T7 are formed during etching of the conductive materials 128 (see FIG. 17C). In the present embodiment, the plurality of buried bit lines 128' respectively forms a straight line extending along the first direction D1. The buried bit lines 128' are located above the bit line contacts 122a, and the buried bit lines 128' are parallel with the plurality of active regions AR. Moreover, the bit line side contacts 122b are used to connect the buried bit lines 128' to the active region AR. After forming the buried bit lines 128', a silicon nitride layer 130 are used to cover the buried bit lines 128'. In particular, the silicon nitride layer 130 completely fills into the gaps of the trenches T7, and an etch-back process is performed so that top surfaces of the silicon nitride layer 130 are coplanar with top surfaces of the mask layer 102.

Next, please refer to FIG. 18A to FIG. 18E, after forming the silicon nitride layer 130, a silicon oxide mold 132 is formed on the silicon nitride layer 130. The silicon oxide mold 132 is, for example, a patterned layer having trenches T8, wherein portions of the mask layers 102 are removed to form the trenches T8. The trenches T8 have patterns that corresponds to a capacitor contact that is formed in a subsequent process.

Next, please refer to FIG. 19A to FIG. 19E, capacitor contacts 134 are formed to fill the gaps of the trenches T8. In the present embodiment, each of the capacitor contacts 134 are located in between two of the buried bit lines 128', and a lower surface of the buried bit lines 128' is located at a higher level than a lower surface of the capacitor contacts 134.

Figure 20:
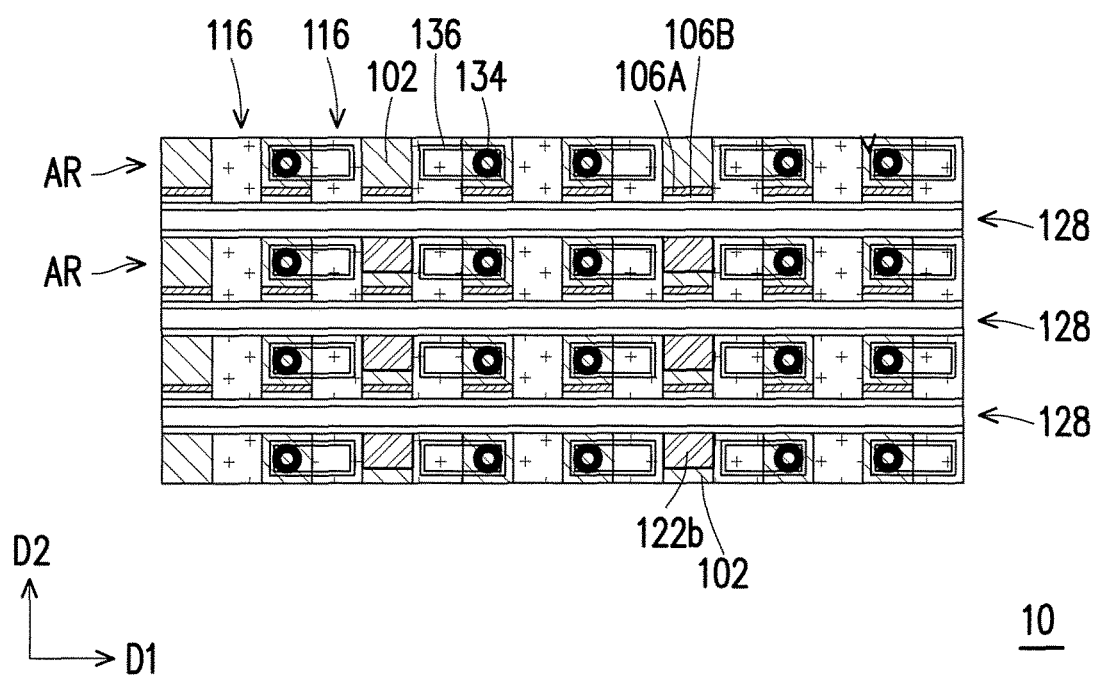

Finally, please refer to FIG. 20, a dynamic random access memory 10 of the invention can be formed. In the present embodiment, after forming the capacitor contacts 134, a plurality of capacitors 136 are formed on the capacitor contacts 134 so that the capacitors 136 are electrically connected to the capacitor contacts 134. In the present embodiment, the capacitors 136 are for example, stacked capacitors instead of being trench capacitors. Furthermore, the dynamic random access memory 10 of the embodiment is directed to a 6 $F^2$ DRAM cell or a 8 $F^2$ DRAM cell instead of being a 4 $F^2$ DRAM cell.

Accordingly, the dynamic random access memory of the invention is formed with buried bit lines. The buried bit lines are parallel with the active regions, and a bit line side contact is used to connect the buried bit lines to the active region. The buried bit lines and the active regions both forms a straight line extending along the first direction. Due to the straight active region layout, a pitch between the active region (active area) is relaxed, and a larger active area can be used to achieve a more photo (lithography) friendly process. In addition, a distance between the buried bit lines to the capacitor contacts is increased as compared to conventional structures. As such, a bit line parasitic capacitance is reduced and the bit line sensing margin may be improved. Overall, a dynamic random access memory having better design and performance is achieved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A dynamic random access memory (DRAM), comprising:
   a substrate;
   a plurality of isolation structures located in the substrate, wherein the plurality of isolation structure defines a plurality of active regions extending along a first direction;
   a plurality of word lines located in the substrate, wherein the plurality of word lines is extending along a second direction, the second direction intersects with the first direction;
   a plurality of bit line contacts located above the plurality of isolation structures, wherein each of the bit line contacts have a diffusion region that defines a bit line side contact; and
   a plurality of buried bit lines located above the plurality of bit line contacts, wherein each of the buried bit lines is connected to the active region via the bit line side contact, the buried bit lines is extending along the first direction and is parallel with the plurality of active regions.

2. The dynamic random access memory according to claim 1, further comprising a liner and a spacer covering one side of each of the bit line contacts, wherein the liner and the spacer are located opposite to a side where the bit line side contact is defined.

3. The dynamic random access memory according to claim 1, wherein the plurality of active regions and the plurality of buried bit lines respectively forms a straight line extending along the first direction.

4. The dynamic random access memory according to claim 1, wherein the first direction is perpendicular to the second direction.

5. The dynamic random access memory according to claim 1, further comprising:
   a plurality of capacitor contacts, wherein each of the capacitor contacts are located in between two of the buried bit lines, and a lower surface of the buried bit lines is located at a higher level than a lower surface of the capacitor contacts; and
   a plurality of capacitors located on the plurality of capacitor contacts.

6. The dynamic random access memory according to claim 5, wherein the plurality of capacitors is stacked capacitors.

7. The dynamic random access memory according to claim 1, wherein the active region and the buried bit lines are located at a same level height.

8. The dynamic random access memory according to claim 1, wherein the dynamic random access memory is a 6 $F^2$ DRAM cell or a 8 $F^2$ DRAM cell.

9. A method of fabricating a dynamic random access memory, comprising:
   providing a substrate and defining trenches in the substrate;

forming a plurality of isolation structures in the trenches of the substrate, the plurality of isolation structures defines a plurality of active regions extending along a first direction;

forming liners and spacers above the isolation structures and on one sidewall of the trenches through an angled ion implantation process;

forming a plurality of word lines in the substrate, wherein the plurality of word lines is extending along a second direction, the second direction intersects with the first direction;

forming a plurality of bit line contacts above the plurality of isolation structures, wherein each of the bit line contacts have a diffusion region that defines a bit line side contact, the liners and the spacers are covering one side of each of the bit line contacts; and forming a plurality of buried bit lines located above the plurality of bit line contacts, wherein each of the buried bit lines is connected to the active region via the bit line side contact, the buried bit lines is extending along the first direction and is parallel with the plurality of active regions.

10. The method of fabricating a dynamic random access memory according to claim 9, wherein the formation of the liners and the spacers above the isolation structures and on the one sidewall of the trenches through the angled ion implantation process comprises the following steps:

forming the liners and the spacers on a first sidewall and a second sidewall of the trenches above the isolation structure;

forming first oxide layers in the trenches in between the liners and the spacers that are located on the first sidewall and the second sidewall;

forming a mask filling into the trenches and covering the first oxide layers, the liners and the spacers;

performing angled ion implantation on the mask so there are portions of the mask with and without ion implantation;

selectively removing portions of the mask without the ion implantation so that the liners and the spacers formed on the second sidewall of the trenches are exposed;

removing the liners and the spacers on the second sidewall that are exposed, and removing the first oxide layers from the trenches;

removing the mask; and forming second oxide layers in the trenches so that one side of the second oxide layers is covered by the liners and the spacers formed on the first sidewall.

11. The method of fabricating a dynamic random access memory according to claim 10, wherein the angled ion implantation process is performed by using angled phosphorous ion implantation.

12. The method of fabricating a dynamic random access memory according to claim 9, wherein the plurality of active regions and the plurality of buried bit lines respectively forms a straight line extending along the first direction.

13. The method of fabricating a dynamic random access memory according to claim 9, wherein the first direction is perpendicular to the second direction.

14. The method of fabricating a dynamic random access memory according to claim 9, further comprising:

forming a plurality of capacitor contacts, wherein each of the capacitor contacts are formed between two of the buried bit lines, and a lower surface of the buried bit lines is located at a higher level than a lower surface of the capacitor contacts; and forming a plurality of capacitors on the plurality of capacitor contacts.

15. The method of fabricating a dynamic random access memory according to claim 14, wherein the plurality of capacitors is stacked capacitors.

16. The method of fabricating a dynamic random access memory according to claim 9, wherein the dynamic random access memory is a 6 $F^2$ DRAM cell or a 8 $F^2$ DRAM cell.

* * * * *